(12) United States Patent
Goetz

(10) Patent No.: US 11,088,612 B2
(45) Date of Patent: Aug. 10, 2021

(54) FLEXIBLE BOOTSTRAPPING FOR POWER ELECTRONICS CIRCUITS

(71) Applicant: Dr. Ing. h.c. F. Porsche Aktiengesellschaft, Stuttgart (DE)

(72) Inventor: Stefan Goetz, Fostern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 16/955,872

(22) PCT Filed: Sep. 6, 2018

(86) PCT No.: PCT/EP2018/025230
§ 371 (c)(1),
(2) Date: Jun. 19, 2020

(87) PCT Pub. No.: WO2019/120614
PCT Pub. Date: Jun. 27, 2019

(65) Prior Publication Data
US 2020/0395840 A1 Dec. 17, 2020

(30) Foreign Application Priority Data
Dec. 19, 2017 (DE) .................... 10 2017 130 443.6

(51) Int. Cl.
*H02M 1/088* (2006.01)
*H02M 3/155* (2006.01)
*H02M 1/00* (2006.01)

(52) U.S. Cl.
CPC ........... *H02M 1/088* (2013.01); *H02M 3/155* (2013.01); *H02M 1/0048* (2021.05)

(58) Field of Classification Search
CPC .. H02M 1/088; H02M 1/0048; H02M 1/0095; H02M 7/4835
See application file for complete search history.

(56) References Cited

U.S. PATENT DOCUMENTS

| 4,401,926 A | 8/1983 | Morton et al. |
| 5,138,200 A * | 8/1992 | Barsanti ............... H03K 17/063 326/88 |

(Continued)

FOREIGN PATENT DOCUMENTS

| DE | 10 2013 201 562 | 8/2013 |
| DE | 10 2015 112 512 | 2/2017 |

(Continued)

OTHER PUBLICATIONS

International Search Report dated Nov. 27, 2018.

(Continued)

*Primary Examiner* — Yusef A Ahmed
(74) *Attorney, Agent, or Firm* — Gerald E. Hespos; Michael J. Porco; Matthew T. Hespos

(57) ABSTRACT

A method and a charging circuit are provided for flexible bootstrapping in power electronics circuits. The charging circuit includes a blocking diode, at least one bootstrap transistor, at least one resistor and at least one electrical component that is designed to conduct a current flow when a predetermined potential difference is exceeded. An energy storage device used for controlling a power semiconductor switch and a source/emitter potential of the power semiconductor switch are at the same potential. Charging of the energy storage device is effected as soon as the potential of a supply voltage is above a potential of the energy storage device. Overcharging is prevented as soon as the predetermined potential difference in the electrical component is exceeded, and discharging of the energy storage device is prevented by the blocking diode.

10 Claims, 20 Drawing Sheets

(56) References Cited

U.S. PATENT DOCUMENTS

| | | | | |
|---|---|---|---|---|
| 5,394,017 | A * | 2/1995 | Catano | H02M 3/28 307/66 |
| 5,418,673 | A * | 5/1995 | Wong | H03K 17/08122 361/18 |
| 5,646,514 | A * | 7/1997 | Tsunetsugu | H02M 7/2176 323/288 |
| RE35,745 | E * | 3/1998 | Barsanti | H03K 17/063 326/88 |
| 5,963,066 | A * | 10/1999 | Fukunaga | H02M 7/538 323/224 |
| 7,046,050 | B1 * | 5/2006 | Schottler | H03K 17/063 327/108 |
| 7,688,049 | B2 * | 3/2010 | Iwabuchi | H03K 17/063 323/271 |
| 8,779,708 | B2 * | 7/2014 | Miyazaki | H02P 6/34 318/400.27 |
| 9,484,758 | B2 * | 11/2016 | Chen | H02J 7/00 |
| 2004/0130379 | A1 * | 7/2004 | Bolz | H03K 17/04123 327/374 |
| 2007/0279107 | A1 * | 12/2007 | Nuebling | H02P 7/28 327/110 |
| 2008/0303580 | A1 * | 12/2008 | Stegmayr | H03K 17/063 327/390 |
| 2010/0309689 | A1 * | 12/2010 | Coulson | H03K 17/567 363/16 |
| 2011/0133711 | A1 * | 6/2011 | Murakami | H03K 17/0822 323/282 |
| 2013/0194026 | A1 | 8/2013 | Ivankovic | |
| 2013/0214757 | A1 * | 8/2013 | Lee | H03K 17/06 323/311 |
| 2014/0191732 | A1 * | 7/2014 | Tseng | H02M 3/07 320/166 |
| 2016/0134279 | A1 * | 5/2016 | Sicard | H03K 17/168 327/109 |
| 2017/0288511 | A1 * | 10/2017 | Oljaca | H03K 17/567 |
| 2018/0013339 | A1 | 1/2018 | Goetz | |
| 2018/0034384 | A1 * | 2/2018 | Imura | H02M 7/5387 |
| 2018/0219478 | A1 | 8/2018 | Goetz | |
| 2020/0007041 | A1 * | 1/2020 | Liu | H02M 3/33507 |
| 2020/0036372 | A1 * | 1/2020 | Shankar | H02M 3/07 |
| 2020/0403607 | A1 * | 12/2020 | Escudero Rodriguez | H02M 3/073 |

FOREIGN PATENT DOCUMENTS

| | | |
|---|---|---|
| DE | 10 2016 112 250 | 1/2018 |
| EP | 0 405 407 | 1/1991 |
| JP | 2015-201915 | 11/2015 |
| WO | 2012/015427 | 2/2012 |

OTHER PUBLICATIONS

S.M Goetz et al.—"Modular Multilevel Converter With Series and Parallel Module Connectivity: Topology and Control" In IEEE Transactions on Power Electronics, vol. 30, pp. 203-215.

* cited by examiner

FLEXIBLE BOOTSTRAPPING FOR POWER ELECTRONICS CIRCUITS

BACKGROUND

Field of the Invention

The present invention relates to a method and a charging circuit for flexible bootstrapping in power electronics circuits, which are used, for example, in devices for providing an AC power supply from a battery pack. In addition, a multilevel converter that uses said method and charging circuit is claimed.

Related Art

Currently, battery packs usually installed in electric vehicles are hard-wired units, for example of individual battery cells. At the output, such batteries supply almost exclusively DC voltage, whereas most consumers in electric vehicles require an AC voltage with a certain frequency, amplitude and phase. In addition, the DC voltage supplied varies according to the state of charge. In order to be able to supply connected consumers with the required power both at a peak voltage and at a final charging voltage, up to now they have had to be equipped with elaborate supply circuits, e.g. with power semiconductor switches. If a voltage required by a consumer deviates greatly from the battery voltage, a power electronics circuit causes high losses and distortions in the output voltage. In particular, this has an adverse effect on a drive electric motor, which usually requires alternating voltages with significantly lower amplitude, particularly at low speeds, and also stresses its insulation, thereby shortening the service life.

A further problem with battery packs is that due to variation in the physical and chemical behaviors of the battery cells, in order to enable a uniform state of charge, a so-called battery management system must be provided, which includes an elaborate monitoring of the individual battery cells and, in particular, local charge exchange. Furthermore, a fault in a single battery cell usually requires the entire battery pack to be shut down, as defective battery cells can overheat and catch fire under continued loading.

In contrast to traditional power electronics, which switch input or output voltages between a small number of levels using a few power semiconductor switches to produce a desired voltage on average, modular multi-level converters can supply a voltage in finely graded levels using a dynamically variable electrical configuration of energy storage units arranged in modules, for example, capacitors or batteries. A central multilevel converter in this sense is the modular multilevel converter MMSPC, described by S. M. Goetz, A. V. Peterchev and T. Weyh, "Modular Multilevel Converter with Series and Parallel Module Connectivity: Topology and Control," in IEEE Transactions on Power Electronics, vol. 30. (1), 203-215, January 2015.

A problem with electronic semiconductor switches, especially with field effect transistors, abbreviated as FET, or with bipolar transistors with isolated gate electrodes, abbreviated as IGBT, is that they normally need to be controlled relative to their own potential. For example, if a threshold voltage of a FET is 2 V, for a blocking state a gate potential relative to a source potential must be well below this threshold, while for a conducting state it must be well above this threshold. This can be easily achieved even with a half-bridge—i.e. two semiconductor switches connected in series—as commonly used in inverters, in a so-called low-side switch, since the source of the low-side switch is generally connected to the power supply ground of the entire power circuit. In contrast, the source potential of a so-called high-side switch corresponds to a drain potential of the low-side switch and is therefore not fixed. When the low-side switch is closed, the source potential of the high-side switch is at the same ground. However, if the low-side switch is open and the high-side switch is closed, the potential can even be at the upper supply voltage of the half-bridge. When both switches are open, the potential assumes a value between the ground and the upper supply voltage, the exact value being either undefined or dependent on a load, e.g. a motor with a lagging inductance, which forces a steady current flow. Since the source potential of the high-side switch can assume different values, the supply voltage of the gate potential must also be varied for switch activation.

A possible remedy is provided by small, galvanically isolated DC-DC converters, which shift the potential of the ground-referenced supply voltage to the source potential of the high-side switch and thus provide a synchronized sliding supply voltage for the switch activation of the high-side switch. However, such converters are expensive and inefficient.

Alternatively, the process known as bootstrapping can be used. Since in a half-bridge the high-side switches and the low-side switches are activated alternately at least at specific intervals, a so-called bootstrap capacitor, although other energy storage devices are also possible, can be connected to a reference point in such a way that it is available as a short-term or medium-term supply for high-side switch activation and is charged up from the power supply of the low-side switch or another ground-referenced supply via a diode as soon as the low-side switch is closed. The diode prevents energy from flowing back when the low-side switch is opened again and the source potential of the high-side switch increases. For example, for a FET the reference point is provided by the source potential and for bipolar transistors, e.g. IGBTs, an emitter potential is used.

The supply voltage of the gate potential at the high-side switch is thus implemented via an energy storage device, which shifts its potential in parallel and must have a recharging facility. However, in modular multilevel converters in particular, half-bridges with power semiconductor switches are also present in which for circuit design-related reasons a bootstrapping process cannot be used, since in some circuit configurations a bootstrap capacitor would become overloaded. This problem can occur, for example, if the drain/collector terminals instead of the source/emitter terminals of the transistors to be switched are at the potential of the power supply, in particular if partitions of identical modules are formed within multilevel converters, in which transistors to be synchronously switched are conveniently combined into modules but as a result, some of the transistors can no longer be activated by conventional bootstrapping. Conventional bootstrapping requires that the reference potential, i.e. usually the potential of the negative pole, of a bootstrap capacitor is temporarily set to the reference potential of the power supply in order to allow temporary recharging of the bootstrap capacitor, and is higher for the remainder of the time. This means a diode can be used to inhibit current flow and also to block voltage during the above-mentioned time intervals. However, in cases where the reference potential of a bootstrap capacitor can be lower than that of the power supply at least part of the time, the diode would be polarized in the forward direction and could not block. Furthermore, at these times the bootstrap capacitor would overload, since the current flow will not stop until the electrical potential of the positive pole of the bootstrap capacitor matches that of the positive terminal of the power supply. However, since the reference potentials, in this case the electrical potentials of the negative poles of the bootstrap capacitor and the power supply, are not equal, the bootstrap capacitor would be charged to the voltage of the supply voltage plus the difference between the two reference potentials of the bootstrap capacitor and the power supply. This can be far too high. DE 10 2015 112 512 A1 describes a four-quadrant module type for modular multilevel converters, in which the drivers of some transistors cannot be supplied by conventional bootstrapping because their reference potential can be lower than that of the power supply for part of the time. DE 10 2016 112 250 A1 discloses a two-quadrant module that comprises transistors, the driver circuits of which cannot be supplied using conventional bootstrapping for the same reason.

Charging of a bootstrap circuit from a capacitor on starting up is known from U.S. Pat. No. 4,710,685. The charging takes place until such time as another capacitor is charged up to the potential of the supply voltage.

JP 2015-201915 A provides a charging relay to terminate the charging of a capacitor. Charging is stopped as soon as a capacitor voltage and a battery voltage fall below a predefined value.

Finally, U.S. Pat. No. 4,401,926 discloses the charging of a capacitor until it reaches a specified voltage.

Against this background, an object of this invention is to provide a method for recharging a bootstrap capacitor in a power semiconductor switch, wherein the source potential of the power semiconductor switch is subject to fluctuations and no reference point for charging the bootstrap capacitor can be identified from a circuit-design point of view without using expensive and space-consuming DC-DC converters. Furthermore, an object of this invention is to provide a corresponding charging circuit for implementing such a method, and a multilevel converter that uses the method and the charging circuit.

SUMMARY

One aspect of this disclosure relates to a method for flexible bootstrapping in a power electronics circuit, in which an energy storage device used for controlling a power semiconductor switch and a source/emitter potential of the power semiconductor switch are at the same potential. A blocking diode is connected to a supply voltage that is provided by a source referenced to a reference potential, in such a way that the source can only emit, but not absorb, energy via said blocking diode. The blocking diode is followed by at least one bootstrap transistor, the drain/collector input of which is connected to the blocking diode and the source/emitter output to an upper potential of the energy storage device. At least one electrical component is designed to also pass a current flow in the blocking direction if a specified potential difference is exceeded. This component is connected with an input of the electrical component in the blocking direction to a gate/base control terminal of the bootstrap transistor and with an output of the electrical component to a terminal of the energy storage unit at the source/emitter potential of the power semiconductor switch, if the bootstrap transistor is an n-channel field effect transistor or an npn-bipolar transistor. The component is connected in the blocking direction with an input of the electrical component to an upper potential of the energy storage device and with an output of the electrical component to a gate/base control terminal of the bootstrap transistor if the bootstrap transistor is a p-channel field effect transistor or a pnp-bipolar transistor. Correspondingly, in the case of an n-channel field effect transistor or an npn-bipolar transistor as the bootstrap transistor, at least one resistor is arranged between a potential of the supply voltage and the gate/base control terminal of the bootstrap transistor and, in the case of a p-channel field effect transistor or a pnp-bipolar transistor as the bootstrap transistor, the resistor is arranged between the source/emitter potential of the power semiconductor switch and the gate/base control terminal of the bootstrap transistor. This causes a charging of the energy storage device as soon as the potential of the supply voltage is above a potential of the energy storage device, and prevents overcharging as soon as the potential difference specified in the electrical component is exceeded, and thereby preventing discharging of the energy storage device by the blocking diode. Additional resistors to the gate/base control input of the bootstrap transistor can be used to limit the current into or out of the gate/base control input of the bootstrap transistor.

A blocking direction of the electronic component, which is designed to pass a current flow when a specified potential difference is exceeded, results from the direction of the flowing current. If at the input the current then flowing is applied to the electronic component, then at the output the current has passed through the electronic component.

By implementing the method according to the invention, an automatic recharging of the energy storage is achieved if, considered in a potential diagram, the electrical potential of a positive pole of the energy storage device is lower than that of the positive pole of the supply voltage and at the same time, the voltage of the energy storage device is not yet so high that the circuit terminates the charging. Charging occurs, for example, when the energy storage device voltage is below the reference voltage. Furthermore, the energy storage device will be charged if the potential at the negative pole of the energy storage is such that the sum of this potential and the voltage of the energy storage device is less than the sum of the supply voltage and its reference potential. Therefore, for charging of the energy storage device to take place, its potential at the negative pole does not have to be equal to the reference potential of the supply voltage.

One embodiment of the method according to the invention causes a discharge of the energy storage device into the supply voltage to be blocked if the upper potential of the energy storage device is higher than a sum of the supply voltage and its reference potential, and the energy storage unit is charged up with the supply voltage if the energy storage device is more empty than is required by predefined values, e.g. minimum supply voltage requirements of the driver circuit of the power semiconductor switch, and a voltage drop exists from the supply voltage to the energy storage device. On the other hand, the connection to the supply voltage is blocked if a potential from which charging is to be performed, i.e. the sum of the supply voltage and reference potential to which the supply voltage is referred, is above a target potential of the positive pole of the energy storage device and/or the energy storage device has reached a final charging voltage.

Advantageously, the necessary blocking voltages—the person skilled in the art uses the term "dielectric strength"—are preferably broken down in such a way that the highest occurring voltages can be blocked with a diode, because these can also be produced at low cost for higher voltages. Further controllable semiconductors necessary for the implementation of the method according to the invention, such as transistors and the like, therefore require a lower blocking voltage. This is due, for example, to the fact that the blocking is provided by a diode in the discharge direction, but in the forward direction it is provided by a transistor.

In addition, the at least one bootstrap transistor can also be designed to block a maximum voltage occurring in the charging circuit. This can be equal, for example, to twice the magnitude of a voltage that can occur in a module capacitor that is present as an additional energy storage device in a modular multilevel converter.

In one embodiment of the method, a bootstrap capacitor is chosen as the energy storage device. Other energy storage devices, such as a battery, are conceivable.

In a further embodiment of the method, a bipolar transistor is chosen as the at least one bootstrap transistor.

In yet another embodiment of the method, a field effect transistor is chosen as the at least one bootstrap transistor.

In a further embodiment of the method, a Zener diode is chosen as the at least one electrical component. For example, a breakdown voltage of the Zener diode is specified in such a way that it is given by the sum of a switching voltage of the power semiconductor switch, e.g. +15 V, and a voltage magnitude of approximately 650 mV when a bipolar transistor is used as a bootstrap transistor. If a field effect transistor is used as the bootstrap transistor, a breakdown voltage of the Zener diode is specified, for example, in such a way that it is equal to the sum of a switching voltage of the power semiconductor switch, e.g. +15 V, and the threshold voltage of the bootstrap transistor, for example 2 V.

In yet another embodiment of the method, the at least one electrical component is chosen as a unipolar or bipolar transient-voltage suppressor, known to the person skilled in the art by the abbreviation TVS. In yet another embodiment of the method, a voltage standard is chosen as the at least one electrical component. With the transient-voltage suppressor or the voltage standard, the specified voltage can also correspond to the sum of the switching voltage of the power semiconductor switch and the voltage magnitude of approximately 650 mV when a bipolar transistor is used as the bootstrap transistor, or the sum of the switching voltage of the power semiconductor switch and the threshold voltage of the bootstrap transistor when a field effect transistor is used as the bootstrap transistor.

In a further embodiment of the method, if an n-channel field effect transistor or an npn-bipolar transistor is used as a bootstrap transistor, the at least one resistor is selected as a pull-up resistor. The pull-up resistor switches the bootstrap transistor to conducting, so to speak, until the bootstrap transistor is switched off again by the voltage value in the Zener diode, the transient-voltage suppressor or the voltage standard being exceeded.

In yet another embodiment of the method, if a p-channel field effect transistor or a pnp-bipolar transistor is used as a bootstrap transistor, the at least one resistor is selected as a pull-down resistor.

In one embodiment of the method, a voltage upper limit in the energy storage system is maintained by a first bootstrap transistor and a first electrical component that is designed to pass a current flow when a first predefined potential difference is exceeded, and by a second bootstrap transistor and a second electrical component that is designed to pass a current flow if a second predefined potential difference is exceeded, a current limit is maintained when the power semiconductor switch is activated. In particular, if the bootstrap capacitor is discharged extensively and the power transistor is suddenly transferred from a switching state in which the potential of the positive pole of the bootstrap capacitor is far above that of the supply voltage into a switching state in which the bootstrap capacitor can be recharged, a high instantaneous voltage difference can occur between the supply potential from which the charging is to be performed and the potential of the positive terminal of the bootstrap capacitor. Accordingly, without current limiting a sudden high current flow would occur, which can cause various problems including a collapse of the supply voltage, electromagnetic emissions, heating and/or damage to components and conductors.

In addition, a charging circuit for flexible bootstrapping in a power electronics circuit is provided and has at least one energy storage device and at least one power semiconductor switch. The charging circuit comprises a blocking diode, at least one bootstrap transistor, at least one resistor and at least one electrical component which is designed to pass a current flow if a specified potential difference is exceeded. The at least one energy storage device used to control the at least one power semiconductor switch and a source/emitter potential of the at least one power semiconductor switch are at the same potential. The blocking diode is connected in the forward direction to a supply voltage referenced to a reference potential, and the at least one bootstrap transistor is connected with its input to the blocking diode in the forward direction and with its output to an upper potential of the energy storage device in the forward direction. If the bootstrap transistor is an re-channel field effect transistor or an npn-bipolar transistor the at least one electrical component, which is designed to pass a current flow when a specified potential difference is exceeded, is connected with its input to a control terminal of the bootstrap transistor in the blocking direction and is connected in the blocking direction with its output to a terminal of the energy storage device located at the source/emitter potential of the power semiconductor switch. If the bootstrap transistor is a p-channel field effect transistor or a pnp-bipolar transistor, the electrical component is connected with its input to an upper potential of the energy storage unit in the blocking direction and with its output to a control terminal of the bootstrap transistor in the blocking direction. Correspondingly, if the bootstrap transistor is an n-channel field effect transistor or an npn-bipolar transistor the at least one resistor is arranged between a potential of the supply voltage and the base of the bootstrap transistor, and if the bootstrap transistor is a p-channel field effect transistor or a pnp-bipolar transistor, the resistor is arranged between the source/emitter potential of the power semiconductor switch and the base of the bootstrap transistor.

The charging circuit permits recharging of the energy storage device only up to a preset voltage which is adjusted to match the power semiconductor to be controlled and its maximum or ideal control voltage. The charging circuit in this case has an embodiment that uses the supply voltage particularly efficiently.

The energy storage device is recharged from an existing power supply of the overall circuit, which at least temporarily has at least the required supply voltage of the power semiconductor to be controlled compared to the reference potential of the power semiconductor to be controlled (emitter or source). The recharging is activated in such a way that the energy storage device is charged to the selected voltage whenever possible, if the required potential difference is sufficient. Recharging is terminated when the selected voltage is reached. In addition, recharging is terminated when the potential of the supply voltage is lower than the positive potential of the energy storage device, to prevent the energy storage device from discharging into the supply being used.

In a design of the charging circuit, the at least one energy storage device is formed by a bootstrap capacitor.

In a further design of the charging circuit according to the invention, the charging circuit also comprises a threshold switch that is connected to the bootstrap capacitor. To activate at a lower threshold and deactivate again only when an upper threshold is exceeded, such a threshold switch can be a Schmitt trigger and will therefore have hysteresis. Optionally, a voltage sensor can be positioned on a bootstrap capacitor. This threshold switch can be used to monitor the state of charge of the associated bootstrap capacitor. The signal from the threshold switch can be used to block the gate driver to prevent activation of the associated power semiconductor switch if the state of charge of the bootstrap capacitor is insufficient and the power semiconductor switch risks becoming damaged in the half-switched state when the current is flowing. In addition, the threshold switch signal can be transmitted to a higher-level controller, which is also responsible for generating the control signals of the power semiconductor switches, for example.

Finally, a multilevel converter equipped with the charging circuit according to the invention is claimed, which has at least one module storage element and is designed to execute the method according to the invention. The at least one module storage element is designed to store electrical energy. This could be a battery, for example.

The multilevel converter may comprise at least two identical modules. The at least two identical modules each may have at least one power semiconductor switch, the electrical source/emitter potential of which is below the reference potential of the supply voltage of the respective module at least part of the time, and each may have at least one charging circuit. The at least two modules each may comprise at least one DC-to-DC converter and in the at least two modules the supply voltage may be connected in each case via the at least one DC-to-DC converter to the at least one module storage element.

Further advantages and embodiments of the invention are derived from the description and the enclosed drawings.

The aforementioned features and those yet to be explained below can be applied not only in the corresponding specified combination, but also in other combinations or in isolation without departing from the scope of the present invention.

DETAILED DESCRIPTION

Figure 1A:
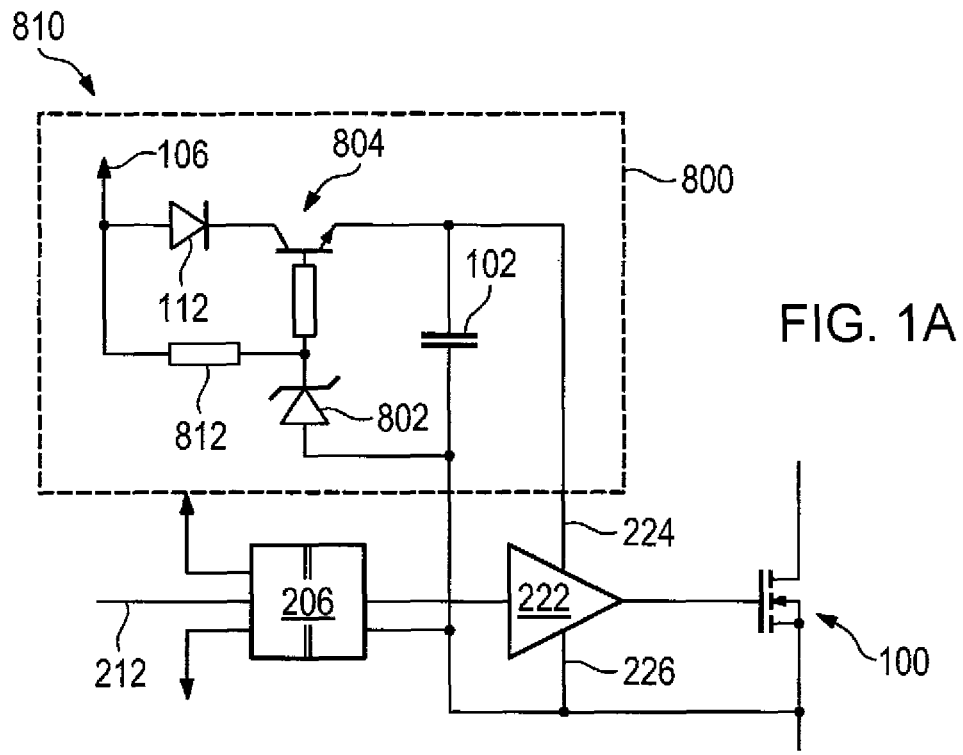
FIGS. 1A and 1B are schematic representations of example circuits for activating a power semiconductor switch using a bipolar transistor in accordance with one embodiment of the invention.
Figure 1B:
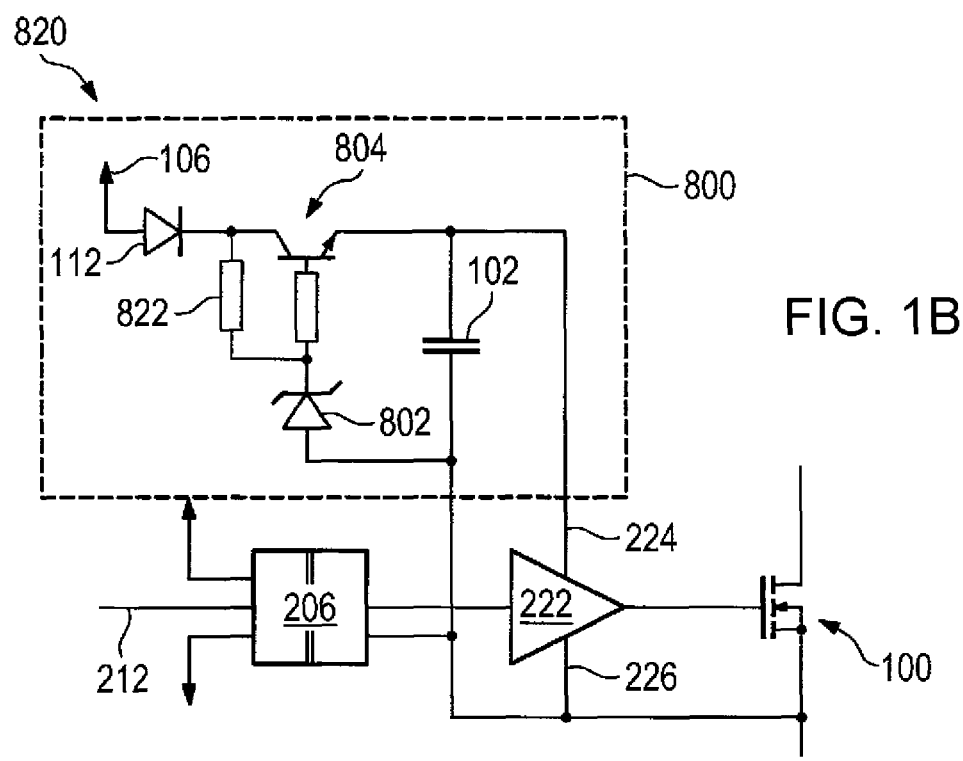

FIGS. 1A and 1B are schematic representations of example circuits 810 and 820 for activating a power semiconductor switch using a bipolar transistor 804 by means of an embodiment of the method according to the invention. The bipolar transistor 804 fulfills the function of the charging switch, wherein its activation potential is different from the potential of the switching signal 212. Accordingly, a level shifter 206 can be optionally used for the control, which shifts the potential of the switching signal 212 to that of the source/emitter reference and which can be integrated together with the driver output stage of the gate driver 222. Preferably, the power is supplied on the input side of the level shifter 206 via the same potential as that of a controller that provides the switching signal 212. The use of an optocoupler or a signal isolator is also conceivable, wherein the switch used in this case does not need to be a power transistor, rather a small signal transistor may be sufficient and therefore a low-cost gate driver 222 does not then necessarily have to be used either. In the circuits 810 and 820, a dashed outline marks an embodiment of a charging circuit 800 according to the invention which comprises a pull-up resistor 812 or 822, a diode 112 blocking the discharge direction, the bipolar transistor 804 and a Zener diode 802. The supply voltage 106 of the charging circuit 800 is referenced to the ground potential of the controller providing the switching signal 212. A breakdown voltage of the Zener diode 802 is given by a switching voltage of the power transistor 100 plus 650 mV. The function of the Zener diode 804 can in general also be replaced by a unipolar or bipolar TVS, an abbreviation for transient-voltage suppressor, voltage standards or similar components which are suitable for generating voltage references, e.g. due to a sharp edge in the current-voltage diagram. The power semiconductor switch 100 can be provided in particular by enhancement mode n-channel IGFETs, an abbreviation for insulated-gate field effect transistors, which block by default, i.e. at 0 V gate-source voltage, and are switched on with a positive voltage. However, it is also conceivable to use n-channel IGBT, npn transistors and common thyristors with a PnpN structure and control of the gate relative to the N region. The gate driver 222 with its supplies 224 and 226 can also optionally be replaced by a different activation circuit of the power semiconductor switch 100. In circuit 810, in a simplified description the pull-up resistor 812, which has a value in the kOhm range, switches on the bipolar transistor until the Zener diode 802 switches it off again. In circuit 820, the pull-up resistor 822 of the bootstrap capacitor 102 is moved behind the blocking diode 112 in order to use a blocking voltage of the blocking diode 112 in the case of negative voltages from the supply potential 106 to the positive terminal of the bootstrap capacitor 102 and to achieve a lower voltage load at the base of the bipolar transistor 804.

Figure 2A:
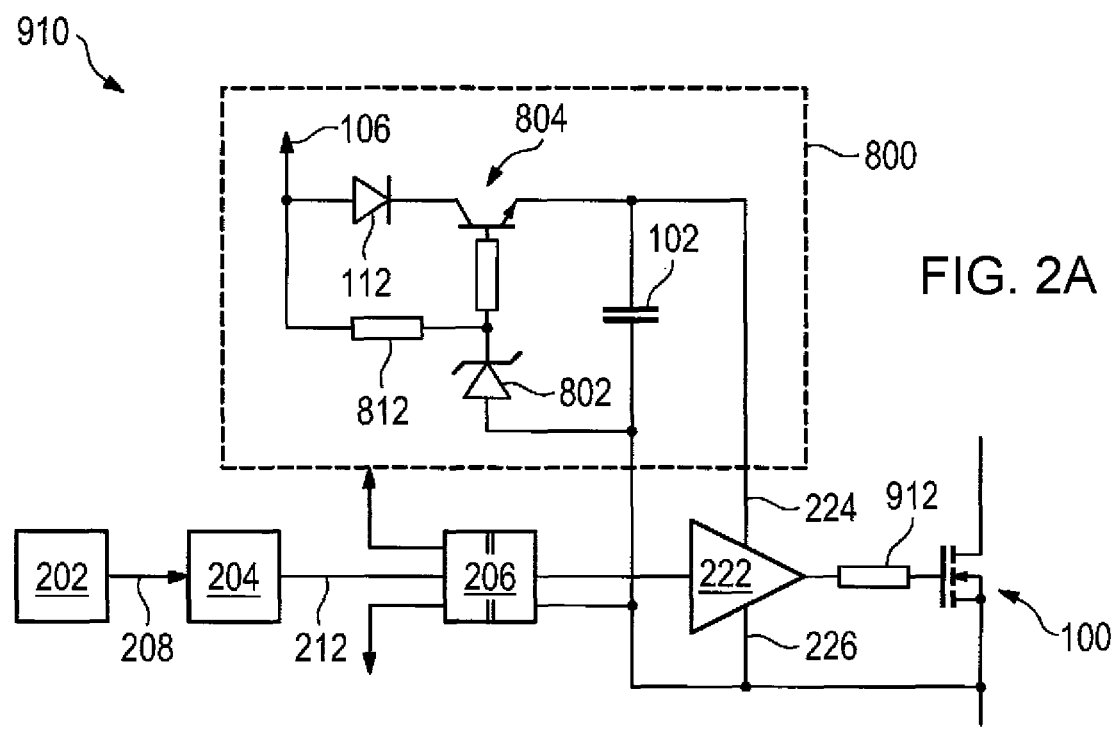
FIGS. 2A and 2B are schematic representations of example circuits for activating a power semiconductor switch using a bipolar transistor, specifically in a multi-level converter, in accordance with an embodiment of the invention.
Figure 2B:
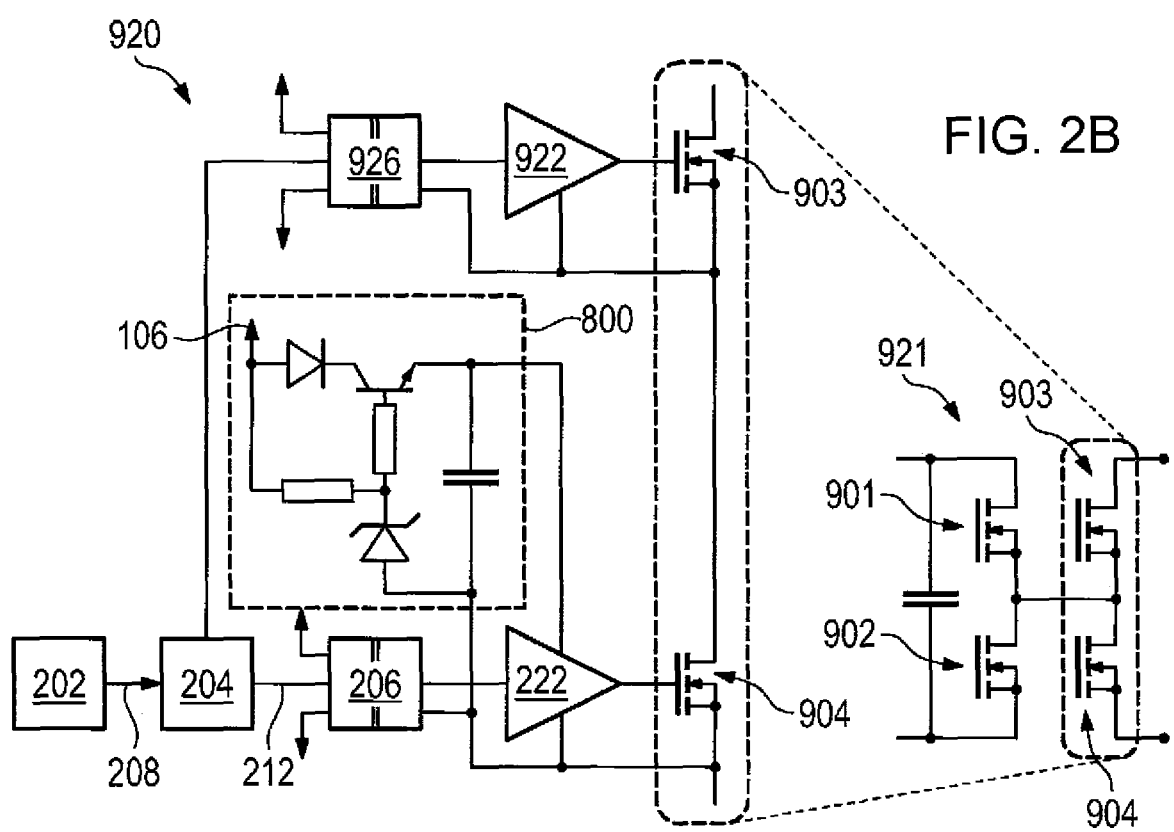

FIGS. 2A and 2B are schematic representations of example circuits 910 and 920 for activating a power semiconductor switch 102 by the bipolar transistor 804 shown in FIG. 1, specifically in a modular multi-level converter, abbreviated as MMC, or as the MMSPC described above in the prior art, by means of an embodiment of the method according to the invention. A detail of such an MMC module with an inter-module connecting element located on the same board consisting of two half-bridges, each consisting of the power semiconductor switches 901 and 902, or 903 and 904, which are movable relative to each other in potential depending on the switch position, is shown in circuit 921. The power semiconductor switches 903 and 904, which are shown with a dashed outline in circuit 921, in particular designated as "Secondary High-side Power Transistor" 903 and "Secondary Low-side Power Transistor" 904, are provided for activation purposes with the circuit 920, which has an optocoupler 206 or 926 and a gate driver 222 or 922 for a respective power semiconductor switch 903 or 904. Especially in MMC/MMSPC modules, the required state of each power transistor is often determined outside the modules in the state module 202, which contains a central controller, and transferred, e.g. in coded form, as state information 208 to the respective controller 204 of a module, which is optionally present on the respective module or centrally. From the respective state information 208 the controller 204 determines specific switching signals 212 for the individual power transistors and converts them, for example using a gate driver 222 by means of the activation already shown in circuit 810 of FIG. 1 in the respective power semiconductor switch 100. When the respective state information is transmitted from the state module 202 to a respective controller 204 of a module, a galvanic isolation of the control signals is usually implemented by means of optocouplers or signal isolators. As an example of the processes described above, circuit 910 shows an embodiment of the method according to the invention, in which an optional gate series resistor 912 is additionally implemented, which is usually supplemented as necessary with diodes and other electrical components in all power transistor gates.

Figure 3A:
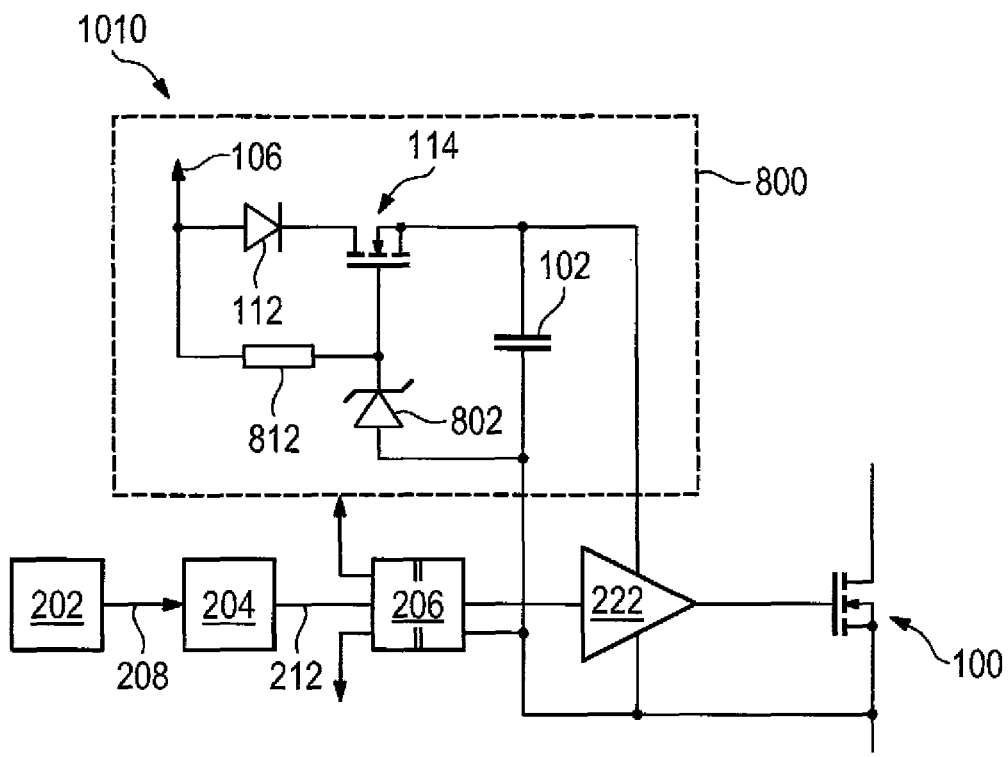
FIGS. 3A and 3B are schematic representations of example circuits for activating a power semiconductor switch using a field effect transistor in accordance with an embodiment of the invention.
Figure 3B:
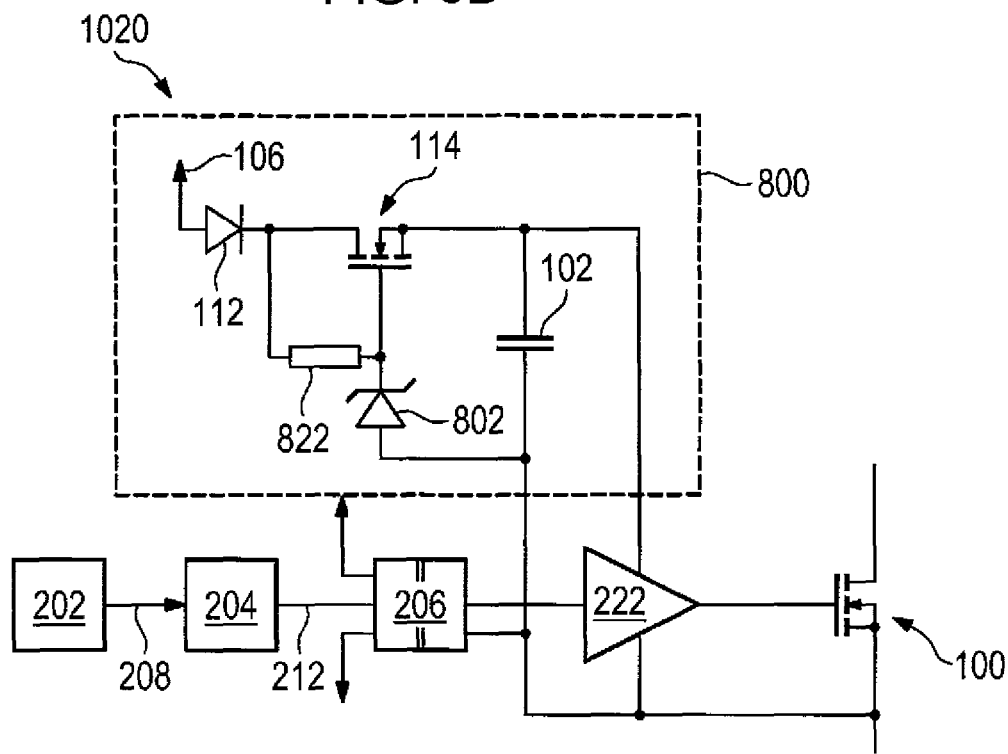

FIGS. 3A and 3B are schematic representations of example circuits 1010 and 1020 for activating a power semiconductor switch 100 by a field effect transistor 114 by means of an embodiment of the method according to the invention. In variation of the circuits 810 and 820 shown in FIG. 1, the function of the charging switch is implemented by a field effect transistor 114. The breakdown voltage of the Zener diode or TVS diode 802 is given by a switching voltage of the power transistor 100 plus a threshold voltage of the field effect transistor 114.

Figure 4A:
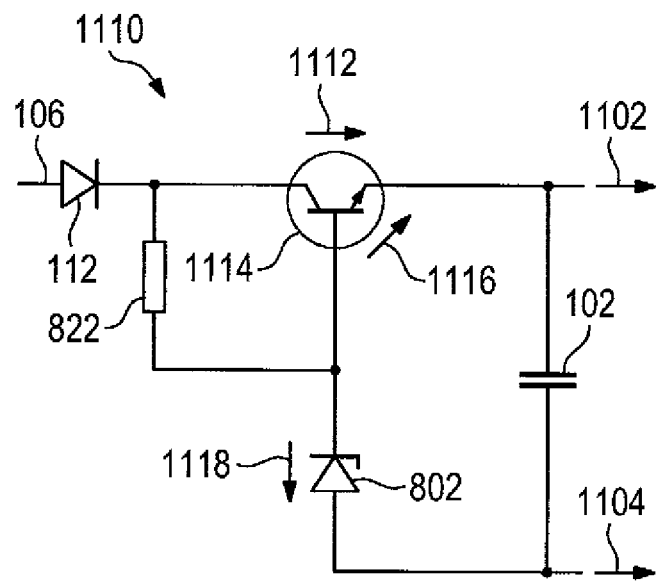
FIGS. 4A and 4B are schematic representations of example circuits for an alternative bootstrap circuit in accordance with an embodiment of the invention.
Figure 4B:
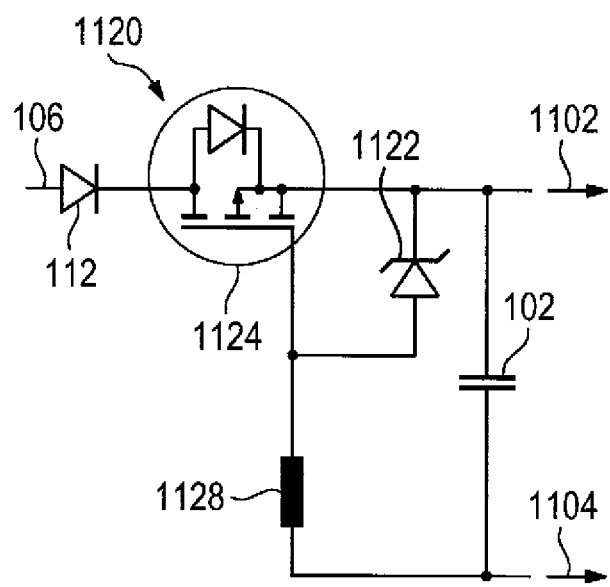

FIGS. 4A and 4B are schematic representations of example circuits 1110 and 1120 to implement an alternative bootstrap circuit by means of an embodiment of the method according to the invention. The supply voltage 106 of the bootstrap circuit 1110 is applied to the diode 112, which blocks the discharge direction. At a transistor 1114 a current is switched at a collector-emitter voltage UCE 1112 for supplying 1102 a gate driver by means of a current at a base-emitter voltage UBE 1116. The breakdown voltage UZ 1118 of the Zener diode 802 is given by a switching voltage of the power transistor 100 plus 650 mV. The bootstrap capacitor 102 has a second terminal 1104 in addition to the terminal 1102, for supplying the gate driver or the source/emitter terminal of the power semiconductor switch. Another alternative bootstrap circuit is shown by the circuit 1120, which has a p-channel field effect transistor 1124 and in which the Zener diode 1122 is connected to a supply 1102 of the gate driver. A pull-down resistor 1128 of 10 kOhm for the gate of the field effect transistor 1124 is connected to the supply 1104 of the gate driver, or the source/emitter terminal of the power semiconductor switch.

Figure 5A:
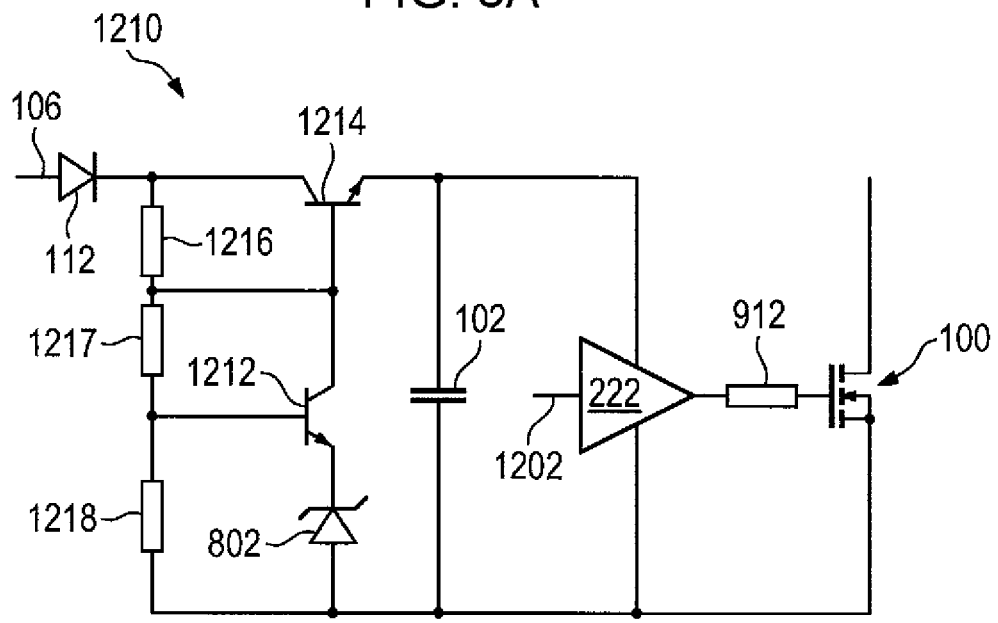
FIGS. 5A and 5B are schematic representations of example circuits for activating a power semiconductor switch using an additional current limiting circuit in accordance with an embodiment of the invention.
Figure 5B:
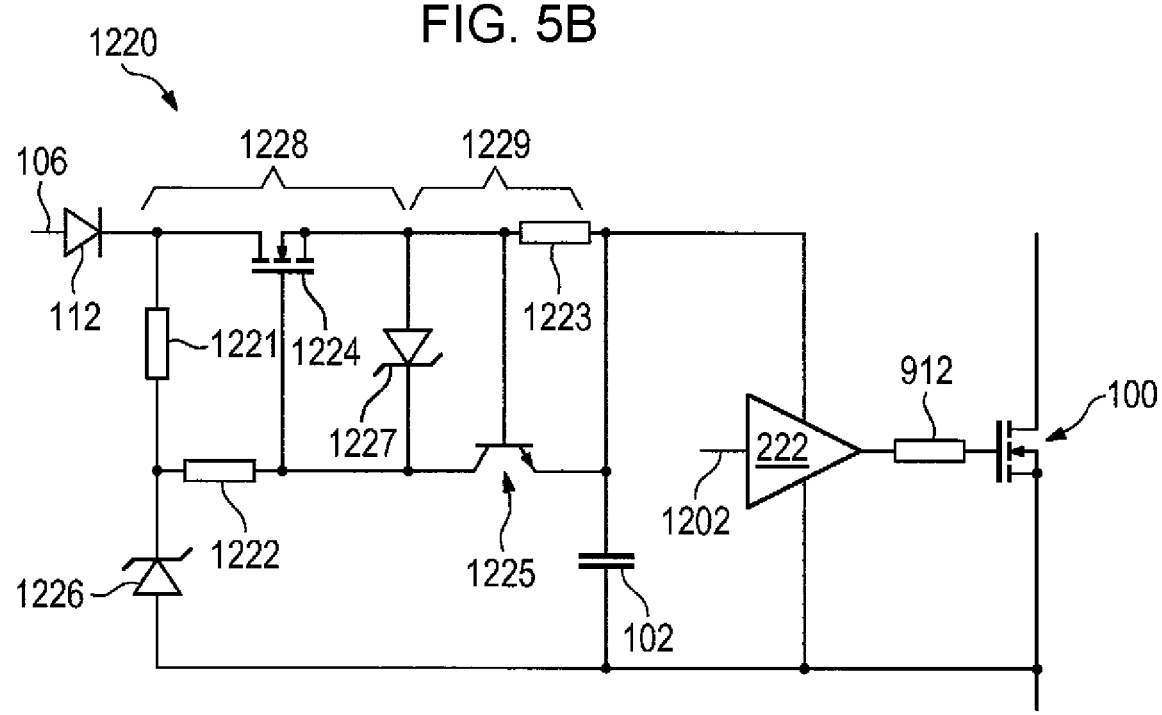

FIGS. 5A and 5B are schematic representations of example circuits 1210 and 1220 for activating a power semiconductor switch 100 with an additional current limiting circuit by means of an embodiment of the method according to the invention. In particular, if the bootstrap capacitor 102 is extensively discharged and the power transistor 100 is suddenly transferred from a switching state, in which the potential of the positive pole of the bootstrap capacitor 102 is far above that of the supply voltage 106, into a switching state in which the bootstrap capacitor 102 can be recharged, a high instantaneous voltage difference can occur between the supply potential 106 from which the charging is to be performed and the potential of the positive terminal of the bootstrap capacitor 102. Accordingly, without current limiting, a sudden high current flow would occur, which can cause various problems including a collapse of the supply voltage 106, electromagnetic emissions, heating, and/or damage to components and conductors. FIG. 5A shows the circuit 1210 where the bootstrap circuit has two transistors 1214 and 1212 and the Zener diode 802. FIG. 5A also shows an example arrangement of resistors 1217 and 1218 in addition to the pull-up resistor 1216, which are inserted into the path between the supply voltage 106 and the bootstrap circuit or between the bootstrap circuit and bootstrap capacitor 102, in order to inhibit correspondingly large currents that arise in particular when the bootstrap capacitor 102 is empty and a large voltage difference suddenly occurs. The gate driver 222 is controlled by a gate control signal 1202. As an alternative or in addition to the resistors 1217 and 1218, an inductance can also prevent a rapid rise in current. Alternatively, as shown in FIG. 5B, a current limiting circuit also shown in circuit 1220 can be integrated into the bootstrap circuit to achieve a regulated charging of the bootstrap capacitor 102 up to the desired voltage. A voltage limit is determined in this case by the components bracketed under the label 1228, including a transistor "Q1" 1224 and two resistors "R1" 1221 and "R2" 1222. The breakdown voltage of the electrical component 1226, which can be a TVS or Zener diode for example, is given by the switching voltage of the power transistor 100 plus a threshold voltage of the transistor "Q1" 1224. An electrical component 1227, which can be a TVS or Zener diode, for example, limits the gate-source voltage of the transistor "Q1" to prevent damage. If the voltage is too high, e.g. 20 V for a suitable TVS or Zener diode, this component 1227 dissipates additional current. A current limit is determined by the electrical components bracketed under the label 1229, including a transistor "Q2" 1225 and a resistor "R3" 1223. While "Q1" 1224 sets a target voltage for the bootstrap capacitor 102, the transistor "Q2" 1225 clamps a transistor gate of "Q1" 1224 or alternatively, if "Q1" 1224 is a bipolar transistor, a transistor base of "Q1" 1224, if the current through "R3" 1223 builds up a sufficiently high voltage, e.g. ~650 mV for bipolar transistors or ~1300 mV for Darlington pairs, which is simultaneously the base-emitter voltage of "Q2" 1225.

Figure 6A:
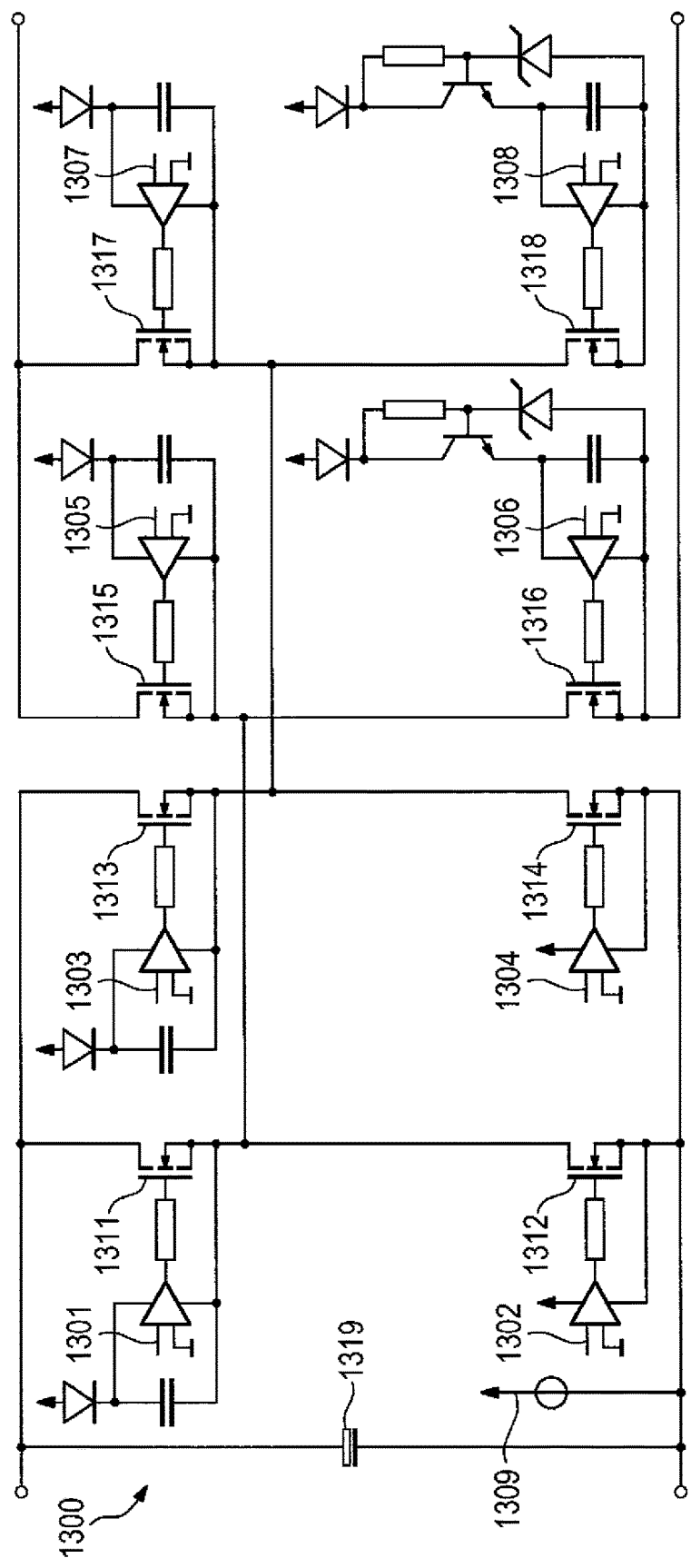
FIGS. 6A and 6B are schematic representations of an example circuit for activating an MMSPC module in accordance with an embodiment of the invention.
Figure 6B:
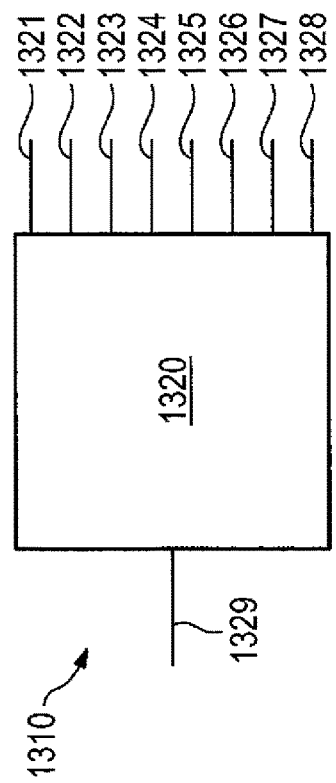

FIG. 6A is a schematic representations of an example circuit 1300 of an MMSPC module using an embodiment of the method according to the invention, and FIG. 6B is a circuit diagram 1310 where a module controller 1310 is additionally shown, the control signals 1321, 1322, 1323, 1324, 1325, 1326, 1327, 1328 of which each form a gate control signal 1301, 1302, 1303, 1304, 1305, 1306, 1307, 1308. The transistors "A" 1311, "B" 1312, "C" 1313, "D" 1314, "E" 1315, "F" 1316, "G" 1317 and "H" 1318 are formed by power semiconductor switches. In the illustrated circuit 1300 of an MMSPC four-quadrant module, a supply 1309 of the gate driver of transistors "B" 1312 and D "1314", which does not necessarily also need to be a module logic supply, which is preferably at 5 V or 3.3 V, is referenced to the negative terminal of the module storage element CM 1319 and has a value of 15 V-18 V, for example. While the power transistors "B" 1312 and "D" 1314 can be activated directly from the supply described above, the supply for the control circuit of transistors "A" 1311 and "C" 1313 is implemented here with separate traditional bootstrap units, i.e. a diode blocking the discharge direction and a bootstrap capacitor, which can be several µF in size, for example. Their respective recharging takes place when transistor "B" 1312 is switched on for transistor "A" 1311, or when transistor "D" 1314 is switched on for transistor "C" 1313, and temporarily pulls the reference potential of the associated bootstrap capacitors to the ground of the supply voltage. However, it should be noted that the bootstrap units are actually independent, i.e. merely because the bootstrap capacitor to transistor "B" 1312 is being charged due to a conducting transistor "A" 1311, this does not mean that the bootstrap capacitor to transistor "D" 1314 is also charged. This is the case in the following states of the inter-module connection: "low-side bypass", "series negative", "parallel". In some cases a "high-side bypass" state can also provide sufficient conditions, however, only if the state of charge of a module connected on the right-hand side is suitable. On closer inspection, "B" 1312 also forms a half-bridge together with "E" 1315, and "D" 1314 forms a half-bridge together with "G" 1317. Transistors "E" 1315 and "G" 1317 can be supplied via standard bootstrapping, as their reference potentials can also be temporarily pulled to the ground of the supply voltage by transistor "B" 1312 or "D" 1314, as can be seen in circuit 1300, due to the horizontally indicated connection of the said transistors, in order to recharge the respective bootstrap capacitors via a respective diode from the supply voltage of the transistors "B" 1312 and "C" 1313. The diode mentioned above may advantageously be a Schottky diode, which has a lower voltage drop across the diode. Recharging also takes place when transistors "B" 1312 or "D" 1314 are switched on (here also the units are independent). This is the case in the following states of the inter-module connection: "low-side bypass", "series negative", "parallel". In some cases a "high-side bypass" state can also provide sufficient conditions, however, only if the state of charge of the module connected on the right-hand side is suitable. However, the power supply required for the transistors "F" 1316 and "H" 1318 can also drift in the negative direction, so that at such instants a standard bootstrap circuit overcharges its associated bootstrap capacitors to significantly excessive voltages. Accordingly, an embodiment of the bootstrap circuit according to the invention is implemented here. The recharging is carried out in each case in states in which the reference potential, i.e. the source or emitter potential, of the transistors is at the potential of the supply voltage and hence that of the transistors "B" 1312 and "D" 1314, as well as below this level, in contrast to the prior art. This is the case in the following states of the inter-module connection: "low-side bypass" and "parallel" at the same potential, as well as "negative series" at lower potential. The design of the bootstrap capacitors must be configured such that the charge is at least sufficient to bridge the time until the next recharge without excessive voltage dip. Ideally, a controller, e.g. the module controller 1320, allows for this property and determines the previous time since the last recharge for each bootstrap capacitor and, if necessary after a time-out has elapsed, forces a corresponding module state to be occupied for recharging. Furthermore, this controller can also estimate the discharge of the bootstrap capacitors with knowledge of the previous and possibly future states and of the discharge into the transistors to be controlled. The gate drivers in the circuit 1300 are shown as galvanically isolating drivers. This means that the input signals may be referenced to another common potential, in this case the negative potential of the module storage element CM 1319, for example. The output of these gate drivers, on the other hand, is referenced to the supply voltage connected to the driver, e.g. by connecting the negative driver supply voltage to the source/emitter terminal of the corresponding transistor. For this purpose, gate drivers can include a so-called level shifter. However, an embodiment according to the invention can likewise be used with gate drivers, the signal input and output of which must be at the same potential. In the latter case, an additional level shifter is preferably used to enable activation of a controller at another potential. In addition, for operation of the MMSPC module, the circuit 1300 can optionally have at least one voltage sensor on module storage element CM 1319, which is read off by the module controller 1320. Furthermore, the circuit 1300 can comprise at least one current sensor, which measures a current flowing into the module storage element CM 1319 and is read off by the module controller 1320. Finally, current sensors can be present on at least one module power terminal, which are read off by the module controller 1320.

The supply voltage and thus the power supply of the control circuits of the power semiconductor switches, for example gate drivers, can be drawn from the module storage element. In addition, the supply voltage can also be used to operate local module control electronics, i.e., in contrast to central controllers or control units that exchange data and/or commands with multiple modules, local module control electronics are controllers or control units that are assigned to a particular module and are preferably localized in or on the corresponding module. Local module control electronics may include, in particular, integrated circuits (IC), such as logic modules, microcontrollers, digital signal processors (DSP), programmable logic modules (CPLD), or programmable gate arrays (FPGA). In addition, the supply voltage can also be used for operating monitoring and measurement circuits and analog-to-digital converters of the corresponding module. If the module storage element comprises batteries and/or capacitors, the charging voltage of which lies in the operating range of the electronic components to be supplied, in particular the control circuits of the power semiconductor switches, the supply voltage can also be provided directly from the aforementioned module storage element.

This means that no external power supply is required for modules that would have to be provided into the module or modules via galvanic isolation, for example via galvanically isolated DC-to-DC voltage converters, thereby resulting in low efficiency at high cost and a non-negligible amount of installation space. In particular in multilevel converters with high voltages, an external supply would have to provide the entire isolation voltage of the system in order to enable a supply at the electrical potential of the respective module. This can range from several kilovolts to megavolts, although the voltage of the supply voltage may be only 15 V, for example.

In many cases however, the required electrical voltage for controlling the power semiconductor switches is lower than the electrical voltage range of the at least one module storage element, e.g. less than 20 V, while the voltage of at least one module storage element, for example, can often be up to 60 V, in particular if it is a battery, or even up to more than 1000 V for high-voltage converters, for example in the power transmission field. In this case, a DC-to-DC converter, in particular a step-down converter (buck converter) is advantageous, which preferably extracts energy unidirectionally from the at least one module storage element and converts it to a lower electrical voltage which is suitable as a supply voltage for the purposes of the invention. If the reference potential of the supply voltage corresponds to the electrical potential of one of the poles of the corresponding module storage element, in particular a galvanically non-isolating step-down converter can then be used, e.g. a switched-inductor buck converter or a switched-capacitor converter. These can be implemented at very low cost, efficiently and with a small size and in contrast to the prior art they do not have to contain large and expensive transformers for galvanic isolation to ensure a certain isolation voltage.

Figure 7A:
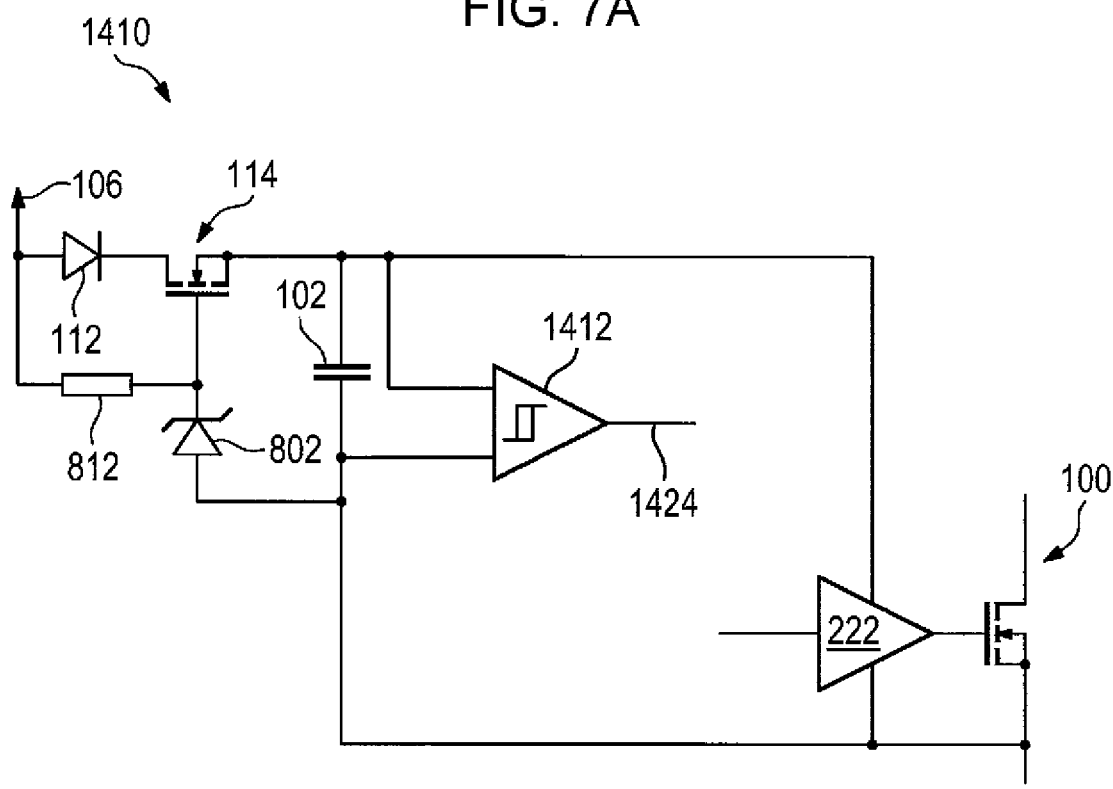
FIGS. 7A and 7B are schematic representations of example extensions of a respective bootstrap circuit in an MMSPC module for implementing an embodiment of the invention.
Figure 7B:
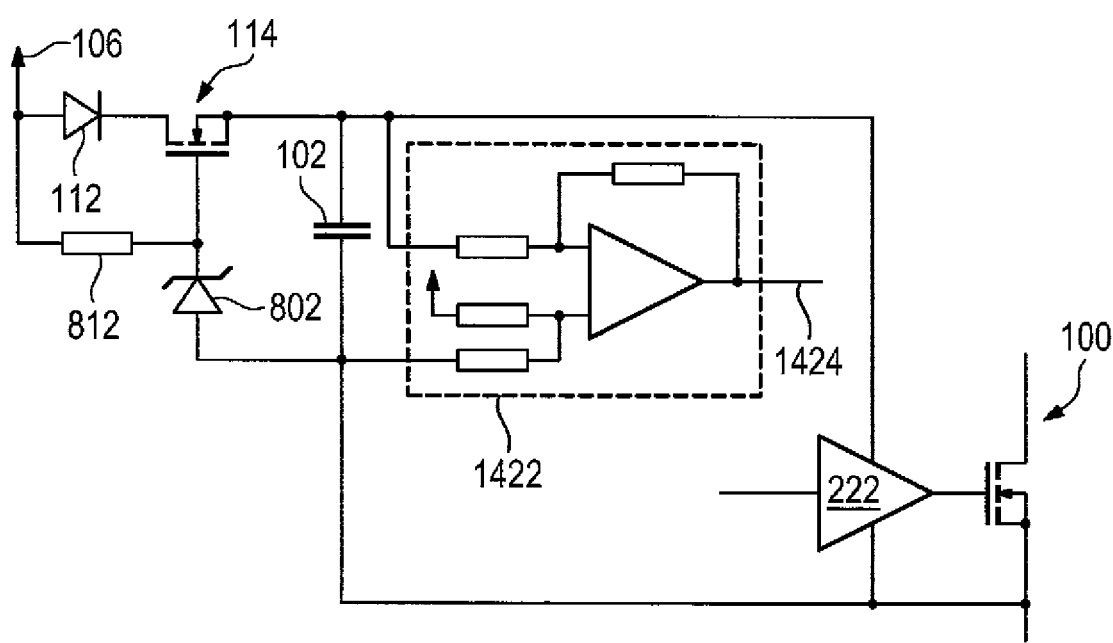

FIGS. 7A and 7B are schematic representations of example extensions 1410 and 1420 to a respective bootstrap circuit in an MMSPC module 1300 shown in FIGS. 6A and 6B, for example. The extended bootstrap circuit 1410 of FIG. 7A has a threshold switch 1412 on the bootstrap capacitor 102. If the voltage is too low, the threshold switch 1412 transmits an output signal 1414, which can be a binary signal, for example, to a module controller, e.g. the module controller 1320 of FIG. 6, so that the latter can provide a recharge in the near future in a module schedule. Alternatively, the module controller 1320 can also force a module state directly, in which the corresponding bootstrap capacitor is charged. In the extended bootstrap circuit 1420 of FIG. 7B, switching at a voltage threshold is achieved with a Schmitt trigger 1422. This therefore has a hysteresis, in order to activate a switching signal 1424 at a lower threshold and to deactivate it again only when an upper threshold is exceeded. Optionally, a voltage sensor can also be positioned on a bootstrap capacitor.

Figure 8:
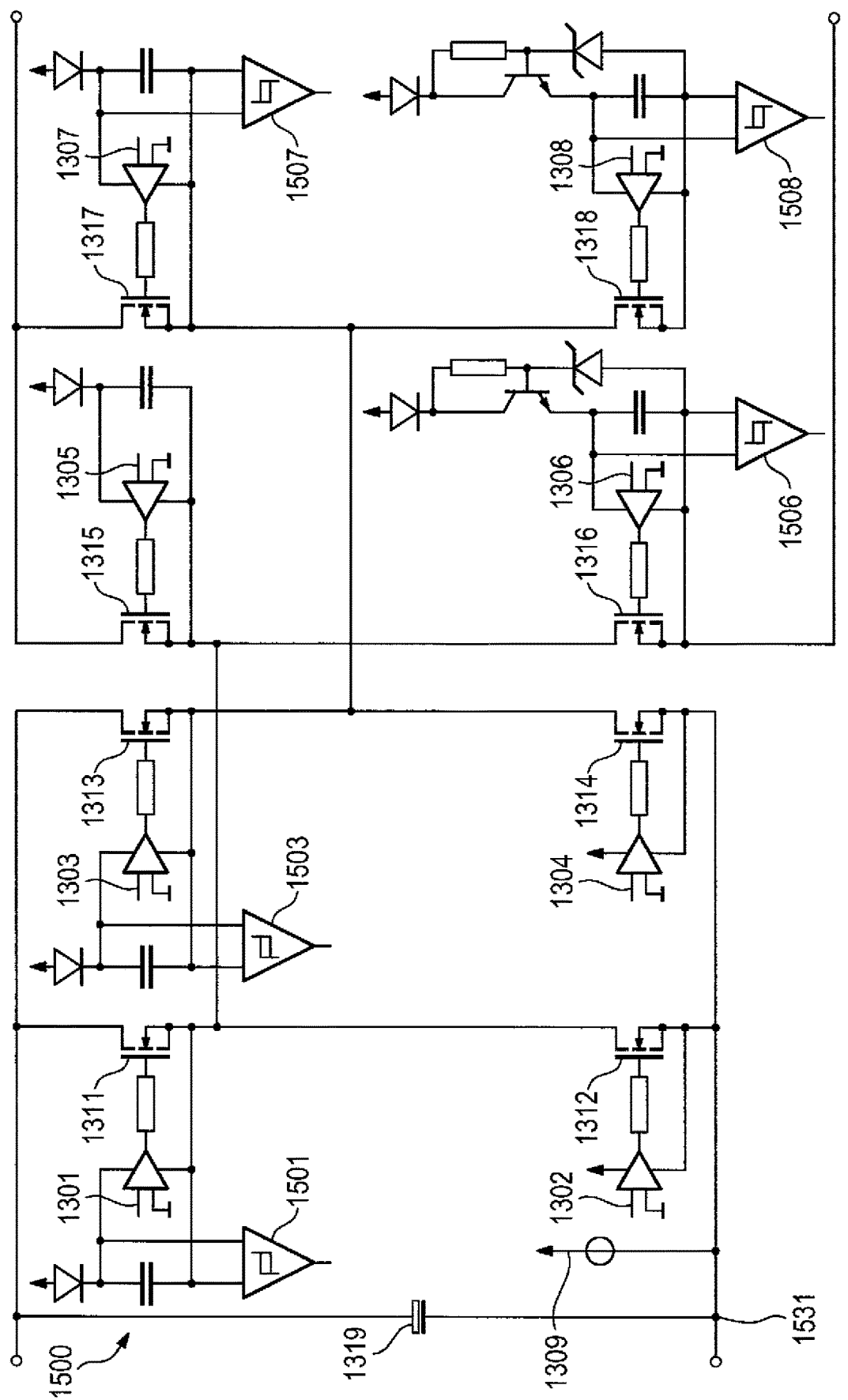
FIG. 8 is a schematic representation of an example circuit of an MMSPC module with threshold switches for implementing an embodiment of the invention.

FIG. 8 is a schematic representation of an example circuit 1500 of an MMSPC module with threshold switches 1501, 1503, 1506, 1507 and 1508 for implementing an embodiment of the method according to the invention. An extended circuit 1410 described above with respect to FIG. 7A is arranged according to the invention on the necessary respective bootstrap circuits for the transistors 1311, 1313, 1316, 1317 and 1318. The negative pole of the supply voltage 1309 is connected to the reference potential 1531 and provides the power supply for the gate drivers of the power semiconductor switches 1312, 1314 directly with source/emitter potential at the reference potential 1531 of the supply voltage 1309. The power supply for the gate drivers of the power semiconductor switches 1311, 1313, 1315, 1317 with respective electrical source/emitter potentials, which at certain times are at the reference potential 1531 and at other times always higher than the reference potential, comprises an energy storage device and a blocking diode. The power supply for the gate drivers of the power semiconductor switches 1316, 1318, the source/emitter potential of which is lower than the reference potential 1531 of the supply voltage 1309 at least part of the time, depending on the conducting state of the power semiconductor switches 1311-1318, comprises for the purpose of the invention a blocking diode, an energy storage device, a bootstrap transistor and an electrical component, which is designed to pass a current flow if a specified potential difference between its terminals is exceeded.

Figure 9:
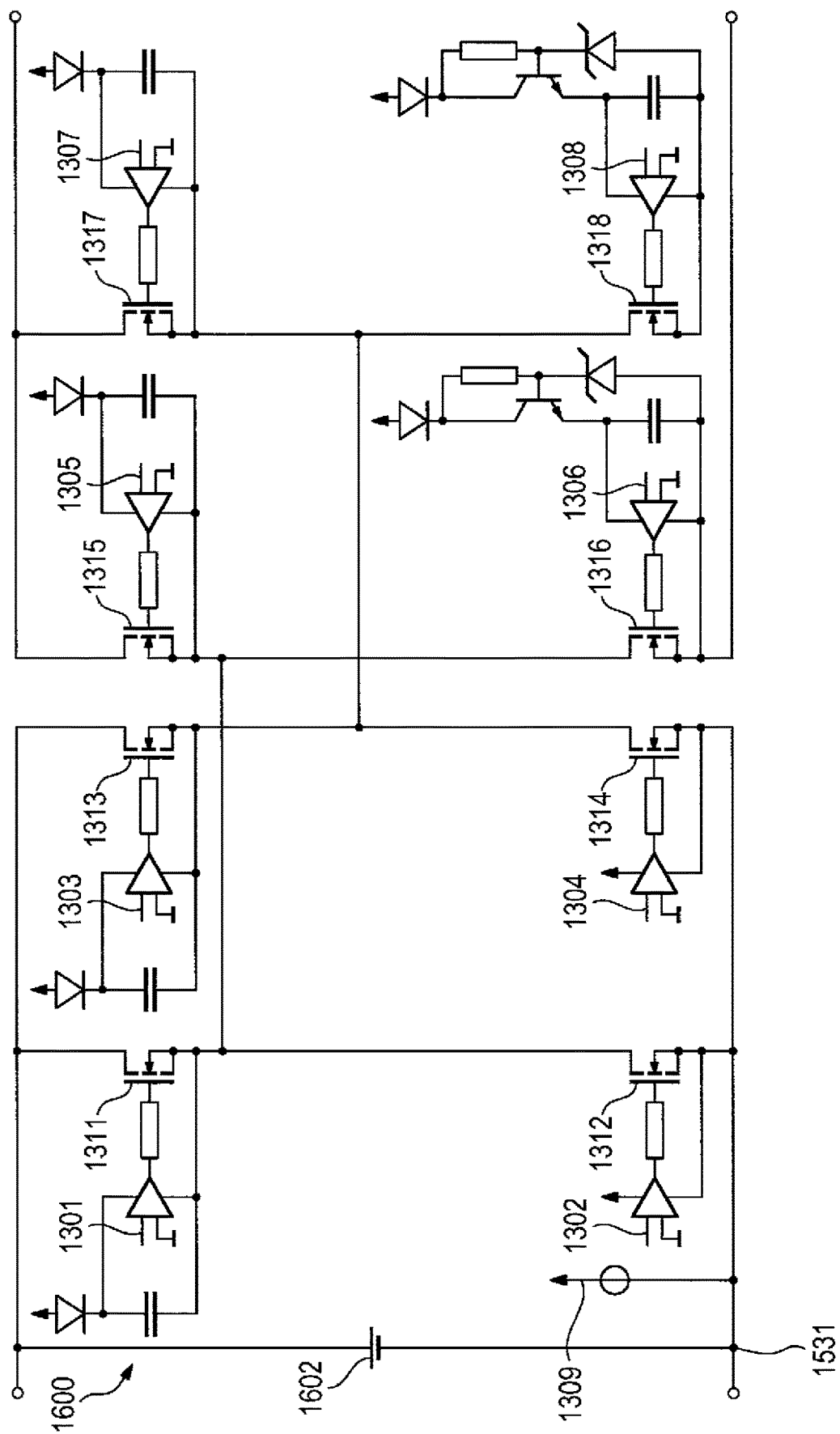
FIG. 9 is a schematic representation of an example circuit of an MMSPC module having a battery as the module storage element for implementing an embodiment of the invention.

FIG. 9 is a schematic representation of an example circuit 1600 of an MMSPC module having a battery 1602 as the module storage element, for implementing a further embodiment of the method according the invention. The module storage element CM 1319 mentioned in the previous figures above is replaced here by a battery 1602.

Figure 10:
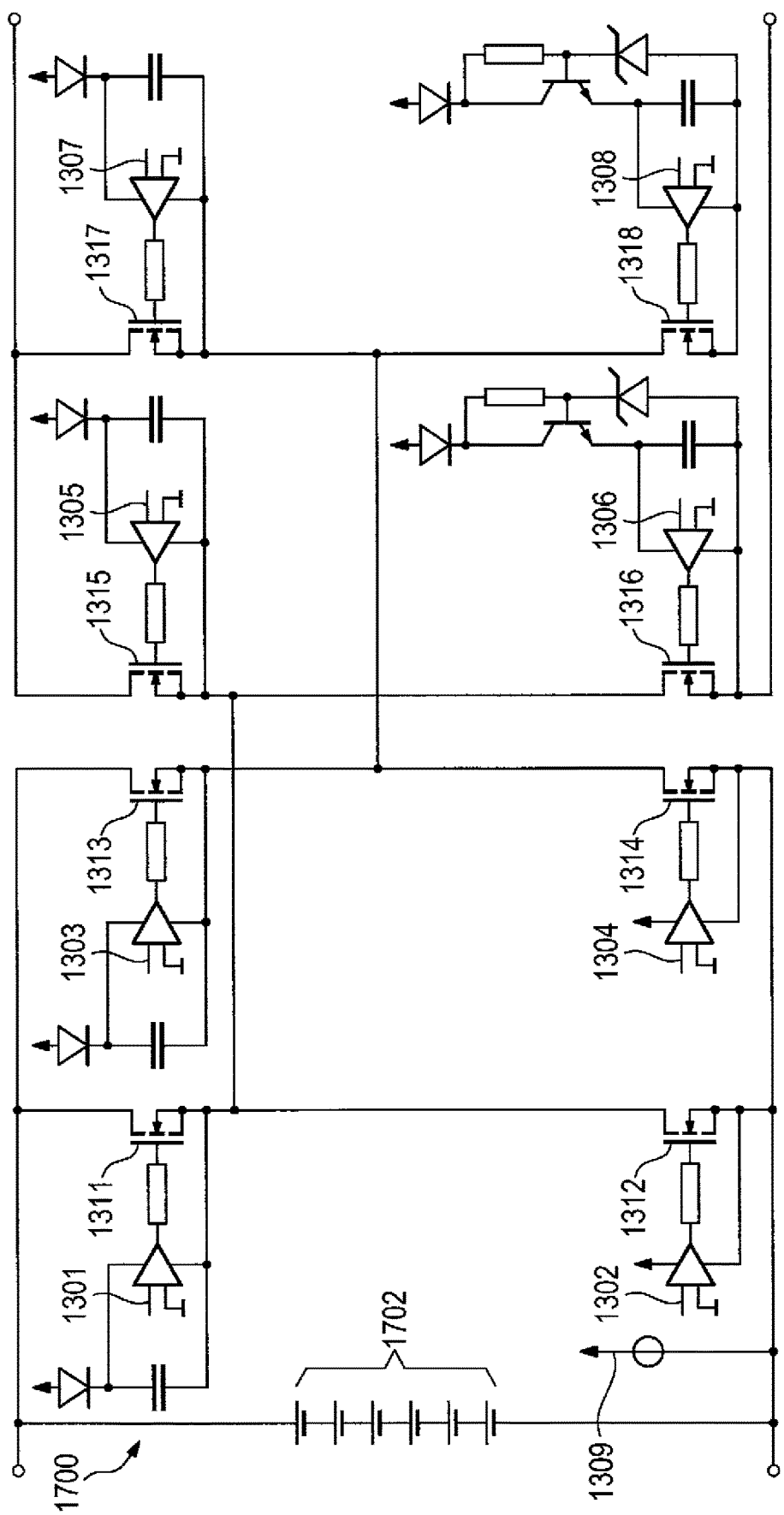
FIG. 10 is a schematic representation of an example circuit of an MMSPC module with a plurality of battery cells as a module storage element for implementing an embodiment of the invention.

FIG. 10 is a schematic representation of an example circuit 1700 of an MMSPC module having a plurality of battery cells 1702 as the module storage element, for implementing yet another embodiment of the method according the invention. The battery cells 1702 can be formed by a battery pack that comprises a plurality of individual cells in a serial-parallel interconnection.

Figure 11:
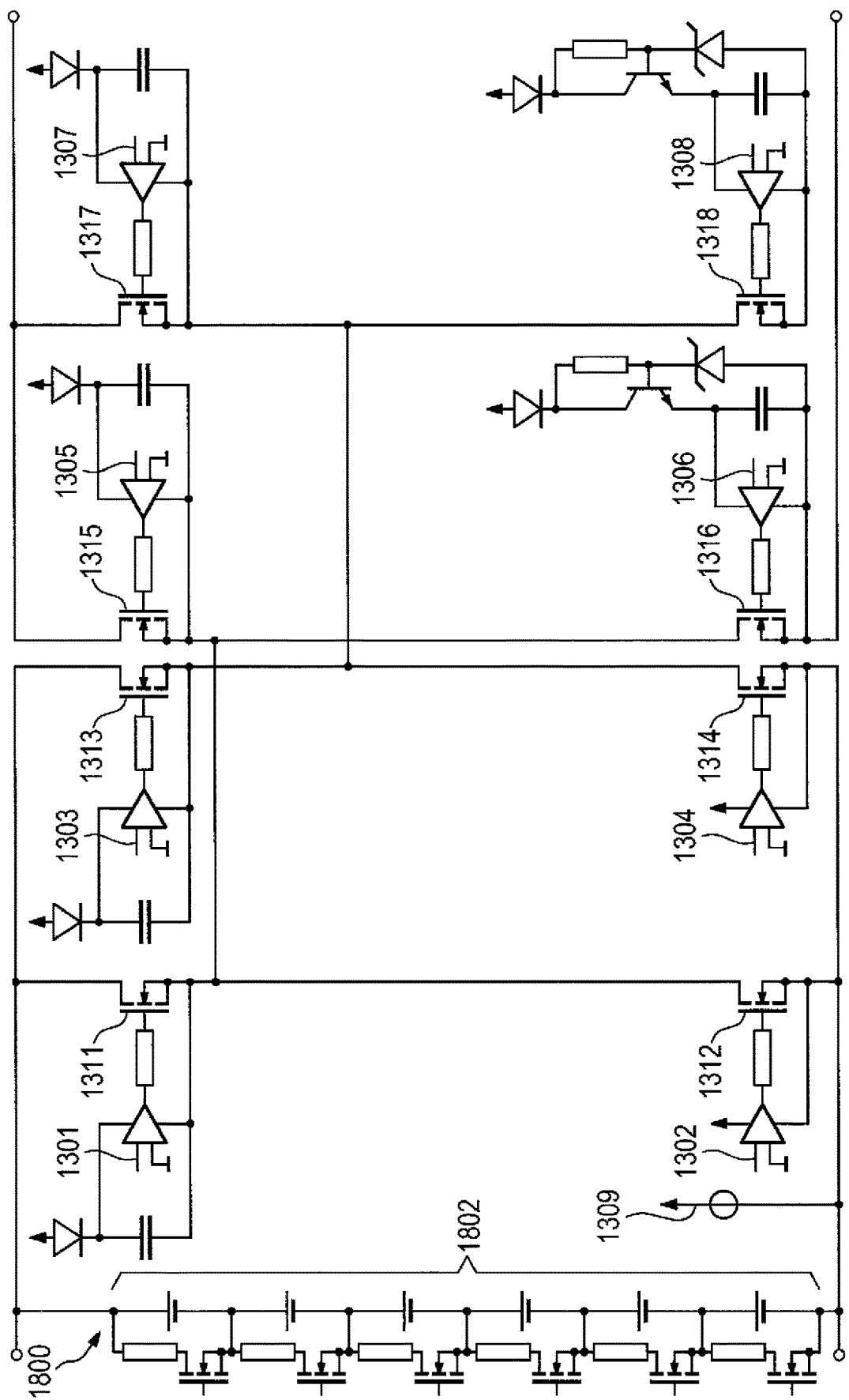
FIG. 11 is a schematic representation of an example circuit of an MMSPC module with a battery-cell balancing system as a module storage element for implementing an embodiment of the invention.

FIG. 11 is a schematic representation of an example circuit 1800 of an MMSPC module having a battery-cell balancing system 1802 as the module storage element, for implementing an embodiment of the method according the invention. The battery-cell balancing system 1802 can comprise lithium-ion cells, in particular.

Figure 12:
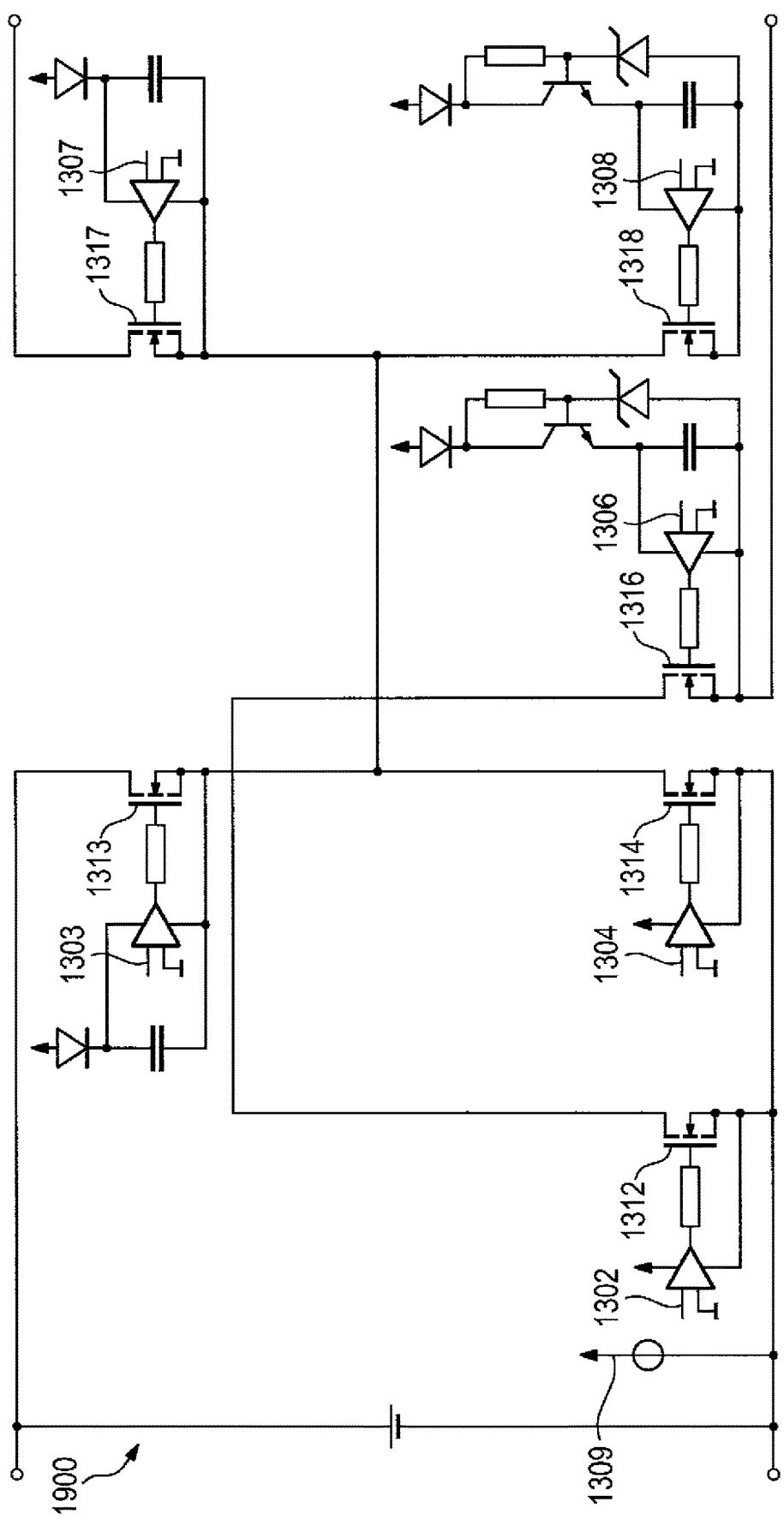
FIG. 12 is a schematic representation of an example circuit of a four-quadrant module with six switches for implementing an embodiment of the invention.

FIG. 12 is a schematic representation of an example circuit 1900 of a four-quadrant module with six transistors 1312, 1313, 1314, 1316, 1317, 1318 for implementing an embodiment of the method according to the invention.

Figure 13:
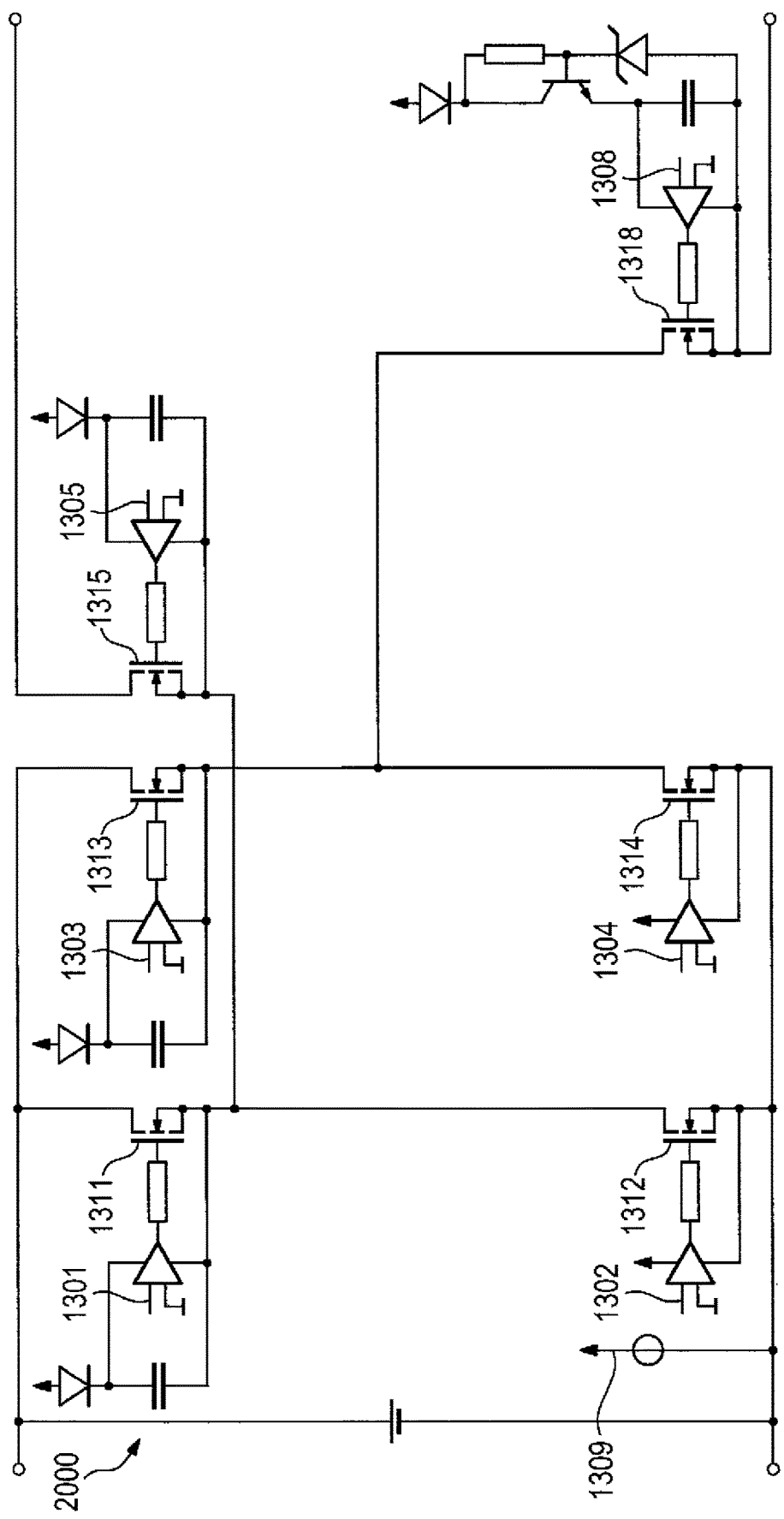
FIG. 13 is a schematic representation of a further example circuit of a four-quadrant module with six switches for implementing an embodiment of the invention.

FIG. 13 is a schematic representation of a further example circuit 2000 of a four-quadrant module with six transistors 1311, 1312, 1313, 1314, 1315, 1318 for implementing an embodiment of the method according to the invention.

Figure 14:
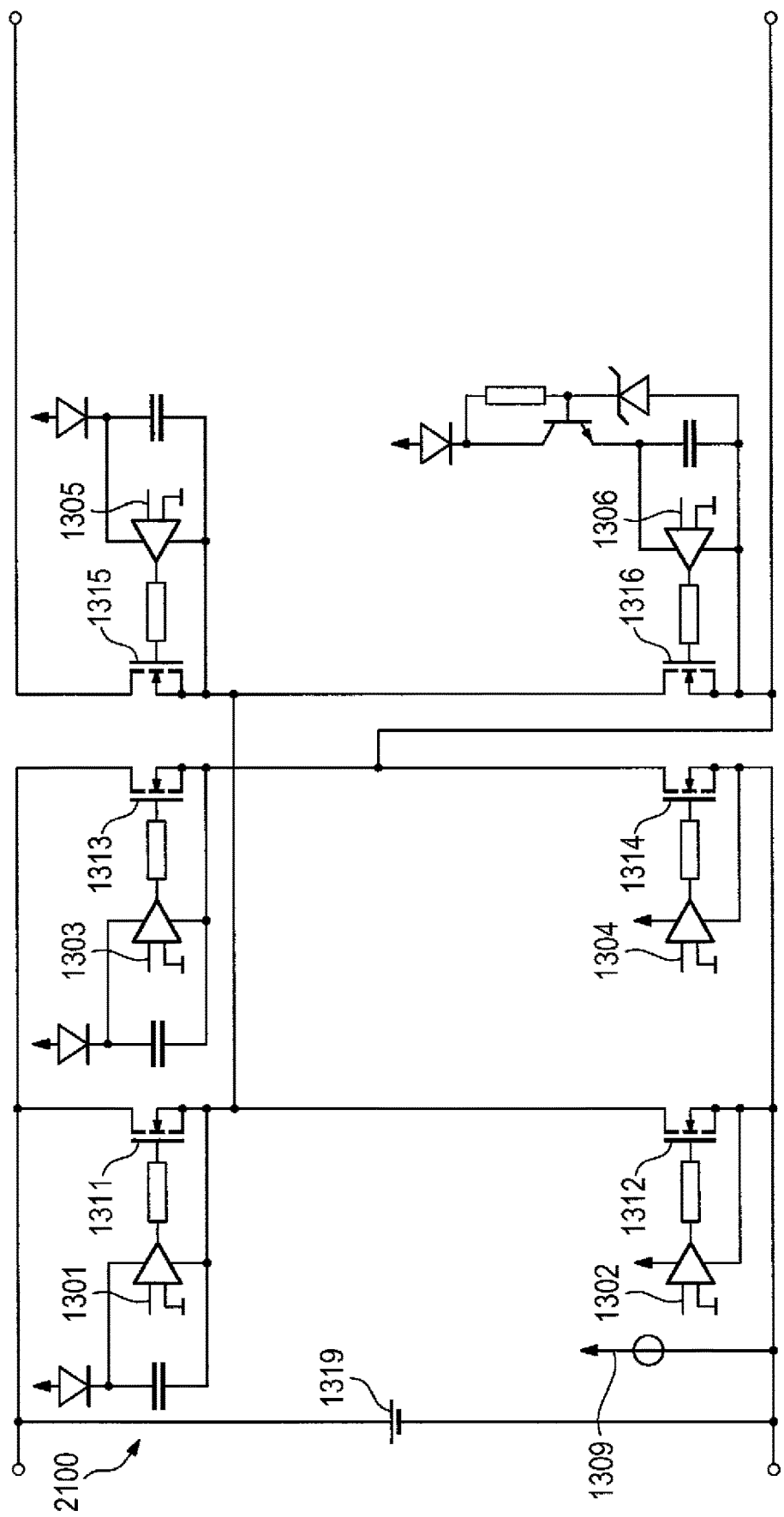
FIG. 14 is a schematic representation of an example circuit of a three-quadrant module with six switches for implementing an embodiment of the invention.

FIG. 14 is a schematic representation of an example circuit 2100 of a three-quadrant module with six transistors 1311, 1312, 1313, 1314, 1315 and 1316 for implementing an embodiment of the method according to the invention.

Figure 15A:
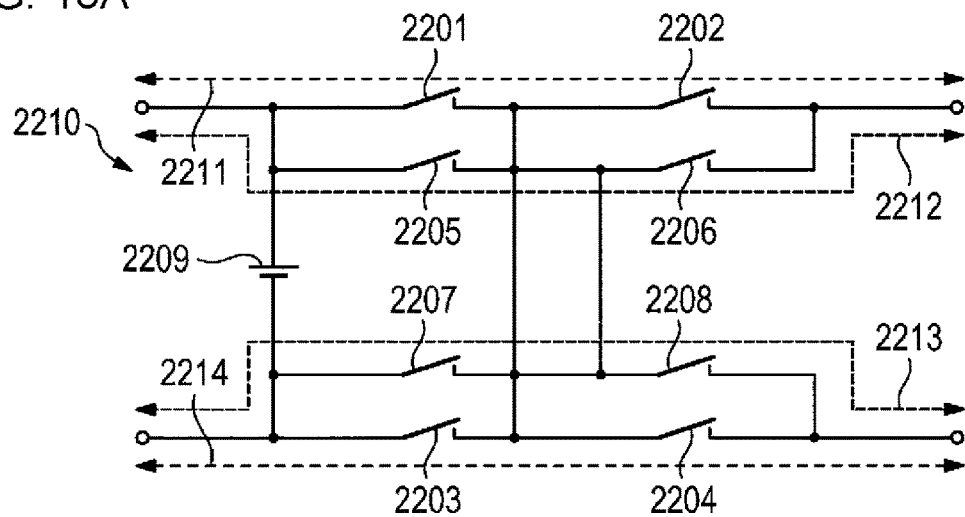
FIGS. 15A, 15B and 15C are schematic representations of exemplary circuits of a four-quadrant module that can be switched by an embodiment of the invention and with parallel conduction paths that give rise to an equal terminal voltage.
Figure 15B:
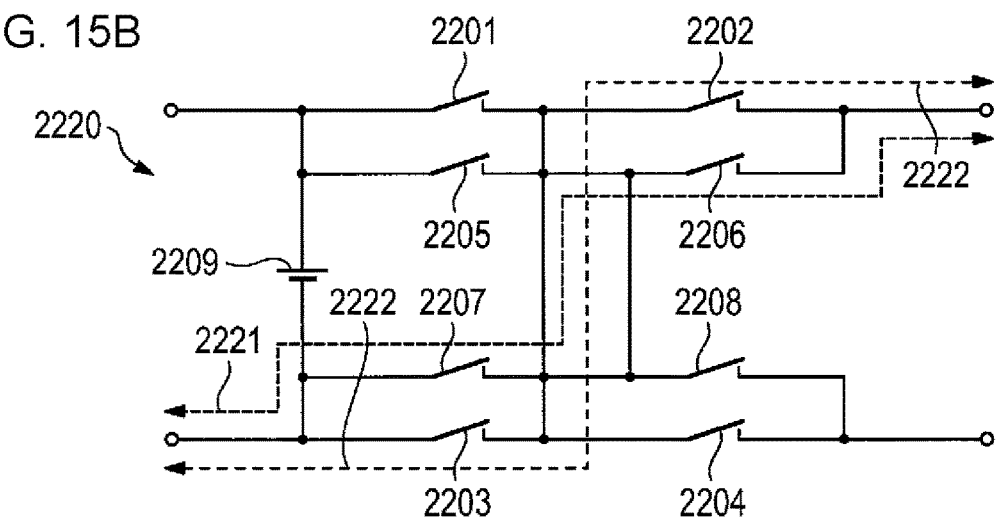
Figure 15C:
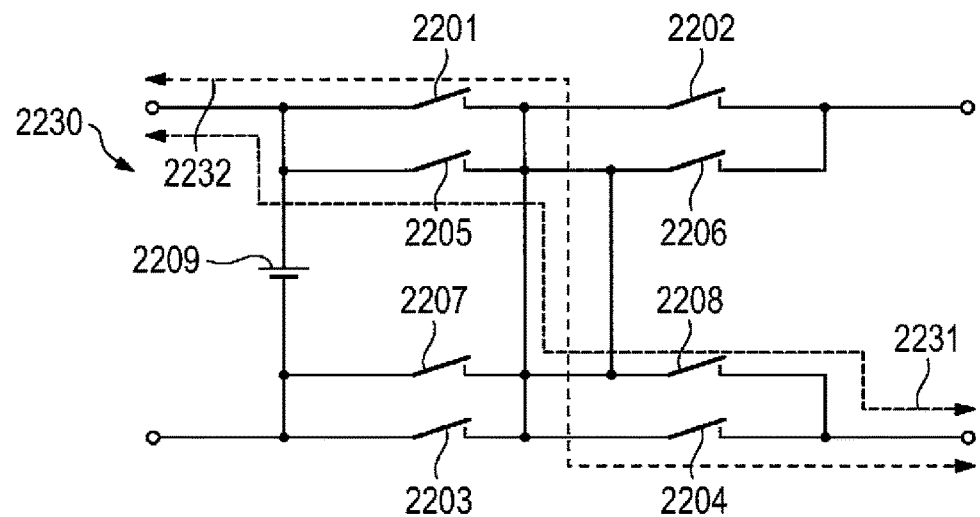

FIGS. 15A, 15B and 15C are schematic representations of exemplary circuits 2210, 2220 and 2230 of a four-quadrant module comprising the module storage element 2209 and eight transistors 2201, 2202, 2203, 2204, 2205, 2206, 2207 and 2208, which can be switched by means of an embodiment of the method according to the invention, parallel conduction paths are indicated which give rise to a constant terminal voltage. In circuit 2210 such parallel conduction paths are formed by a conduction path 2211 and a conduction path 2212, or by a conduction path 2213 and a conduction path 2214, in circuit 2220 such parallel conduction paths are formed by a conduction path 2221 and a conduction path 2222, and in circuit 2230 such parallel conduction paths are formed by a conduction path 2231 and a conduction path 2232. If the respective circuit is only designed to provide a respective terminal voltage through one of the two parallel conduction paths, any transistor located on the respective other conduction path can be eliminated from the respective circuit first. However, the second transistor to be eliminated should be selected in such a way that a connection can still be made from each terminal to any other via the remaining transistors. This constraint results in several possible reduced circuits. If more switches are removed, some possible switching states are eliminated, e.g. "parallel", which can have advantages for certain applications.

Figure 16A:
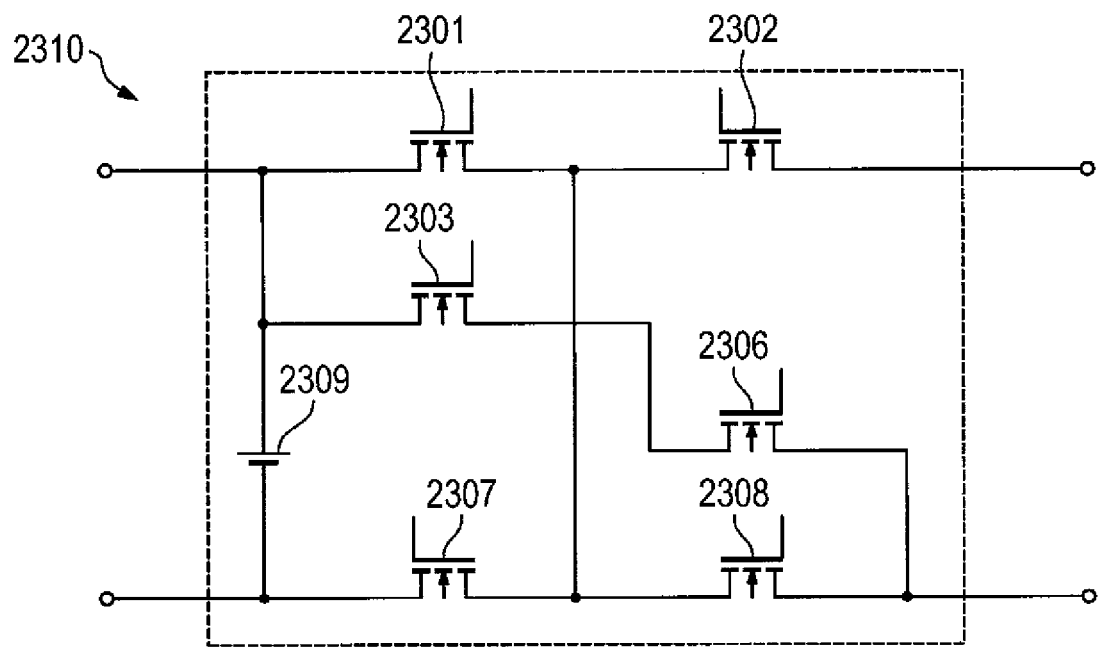
FIGS. 16A and 16B are schematic representations of example circuits of a reduced four-quadrant module that can be switched by an embodiment of the invention.
Figure 16B:
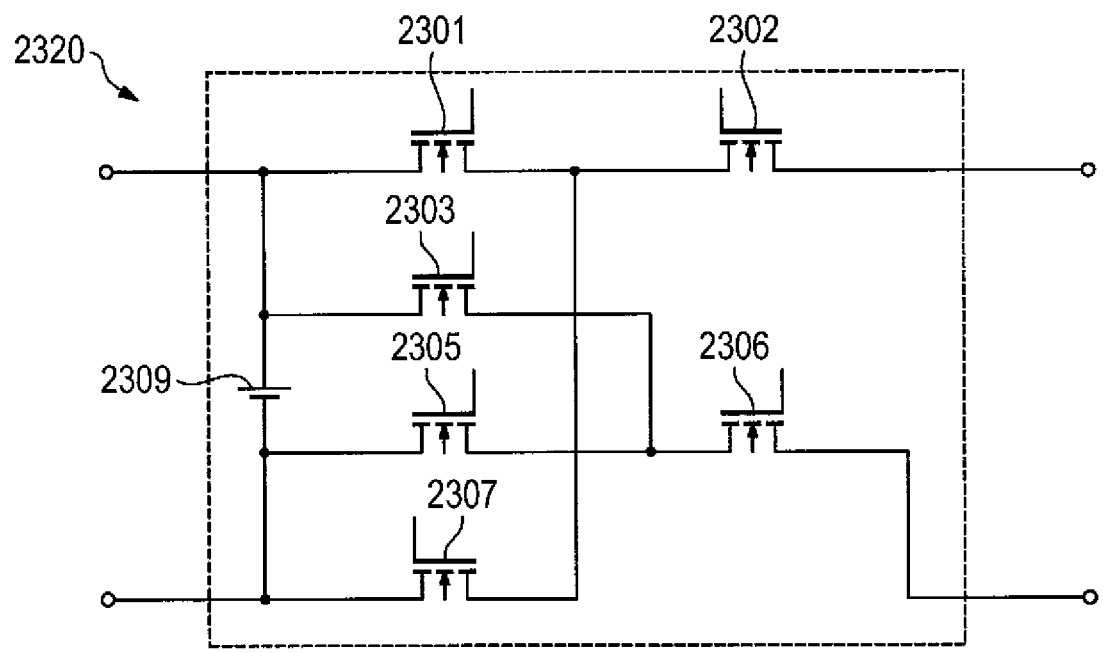

FIGS. 16A and 16B are schematic representations of two exemplary circuits 2310 and 2320 of a respective four-quadrant module, reduced by the constraint from the description of FIGS. 15A, 15B and 15C and comprising the module storage element 2309. In circuit 2310 of FIG. 16A, the four-quadrant module is reduced to transistors 2301, 2302, 2303, 2306, 2307 and 2308. In circuit 2320 of FIG. 16B, the four-quadrant module is reduced to transistors 2301, 2302, 2303, 2305, 2306 and 2307.

Figure 17A:
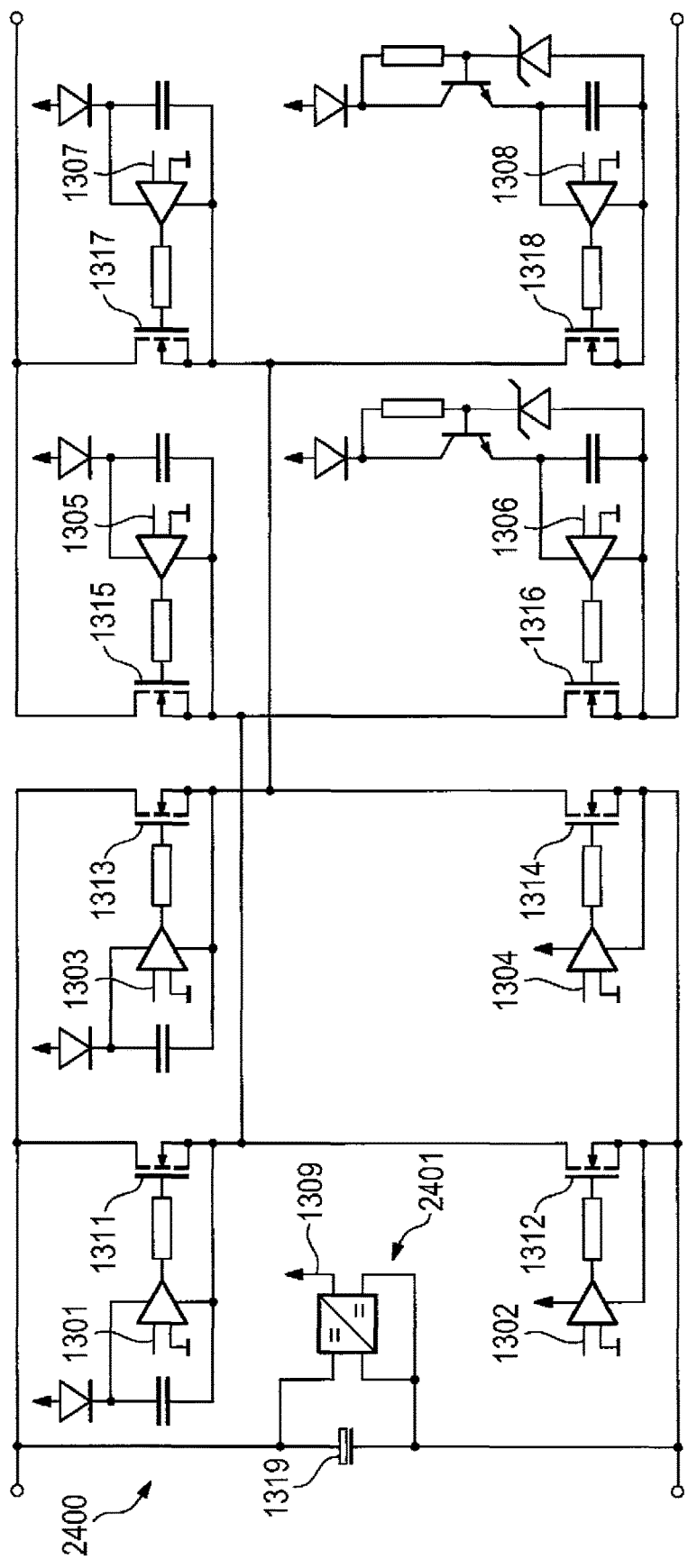
FIG. 17 is a schematic representation of an example circuit in which the bootstrap circuit is supplied from the module storage element via a galvanically non-isolating DC-to-DC converter, for implementing an embodiment of the invention.
Figure 17B:
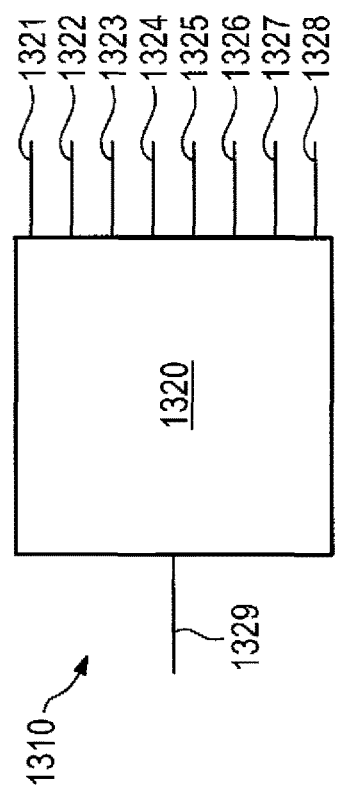

FIG. 17 is a schematic representation of an example circuit 2400 in which the bootstrap circuit is supplied from the module storage element 1319 via a galvanically non-isolating DC-to-DC converter 2401, for implementing an embodiment of the method according to the invention. The reference potential of the supply voltage 1309, in the case shown the negative pole thereof, coincides with the negative pole of the module storage element. In this case, therefore, no expensive galvanic isolation is necessary. The bootstrapping also shifts the energy further towards the respective potentials of the power semiconductor switches 1311, 1312, 1313, 1314, 1315, 1316, 1317, 1318. To control the energy storage device 2400, a module controller 1310 is used.

Figure 18A:
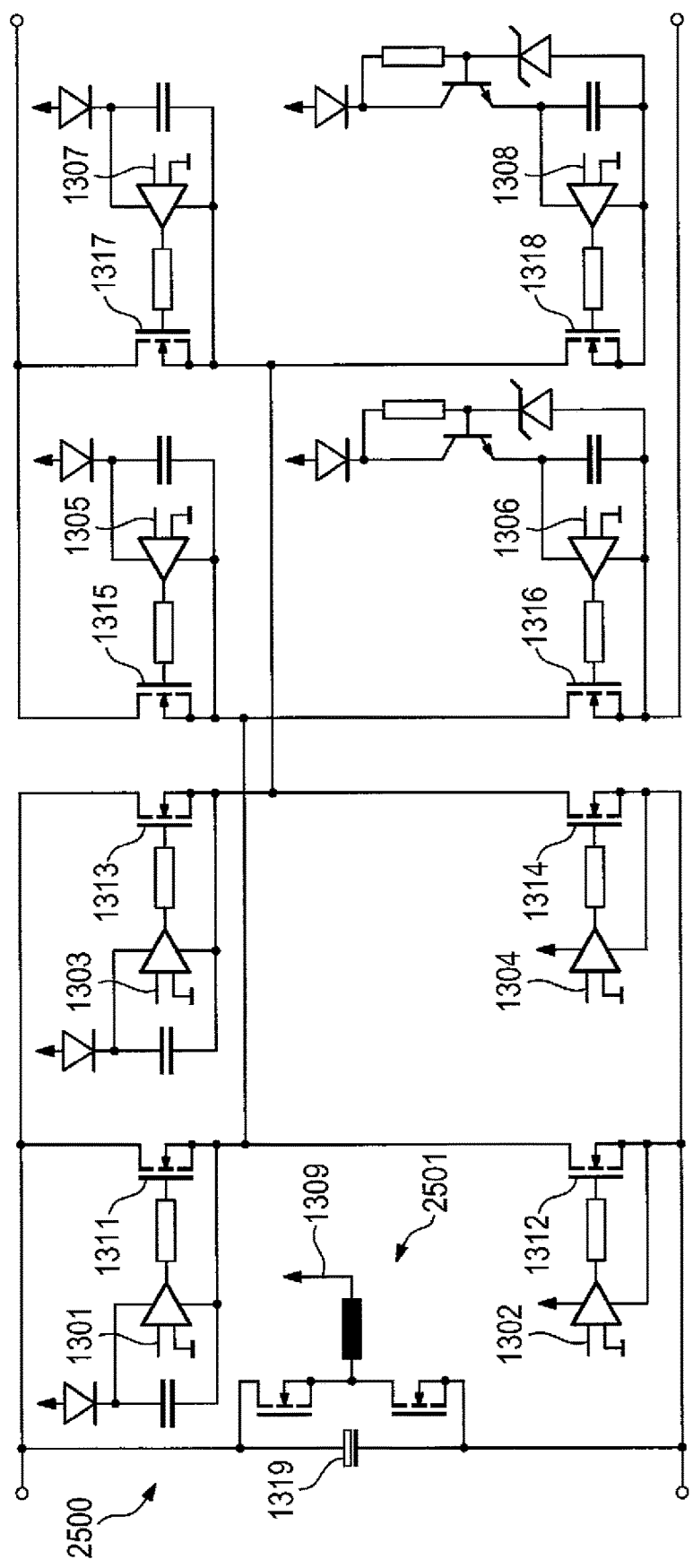
FIG. 18 is a schematic representation of an example circuit in which the bootstrap circuit is supplied from the module storage element via a step-down converter, for implementing an embodiment of the invention.
Figure 18B:
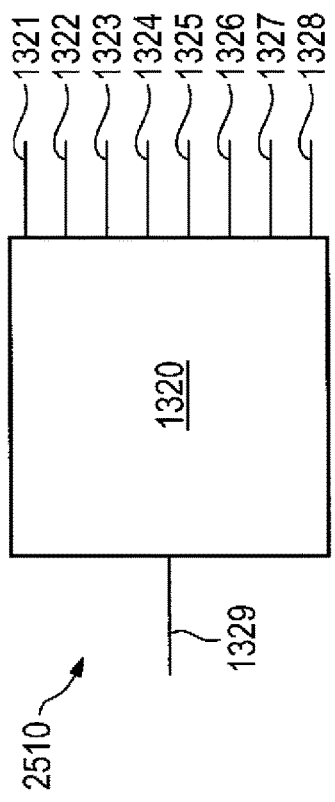

FIGS. 18A and 18B are schematic representations of an example circuit 2500 in which the bootstrap circuit is supplied from the module storage element 1319 via a buck converter 2501, for implementing an embodiment of the method according to the invention. The embodiment according to the invention shown with circuit 2500 in FIG. 18A is obtained from the circuit 2400 in FIG. 17 by the DC-to-DC voltage transformer 2401 being specifically formed by a buck converter 2501.

Figure 19A:
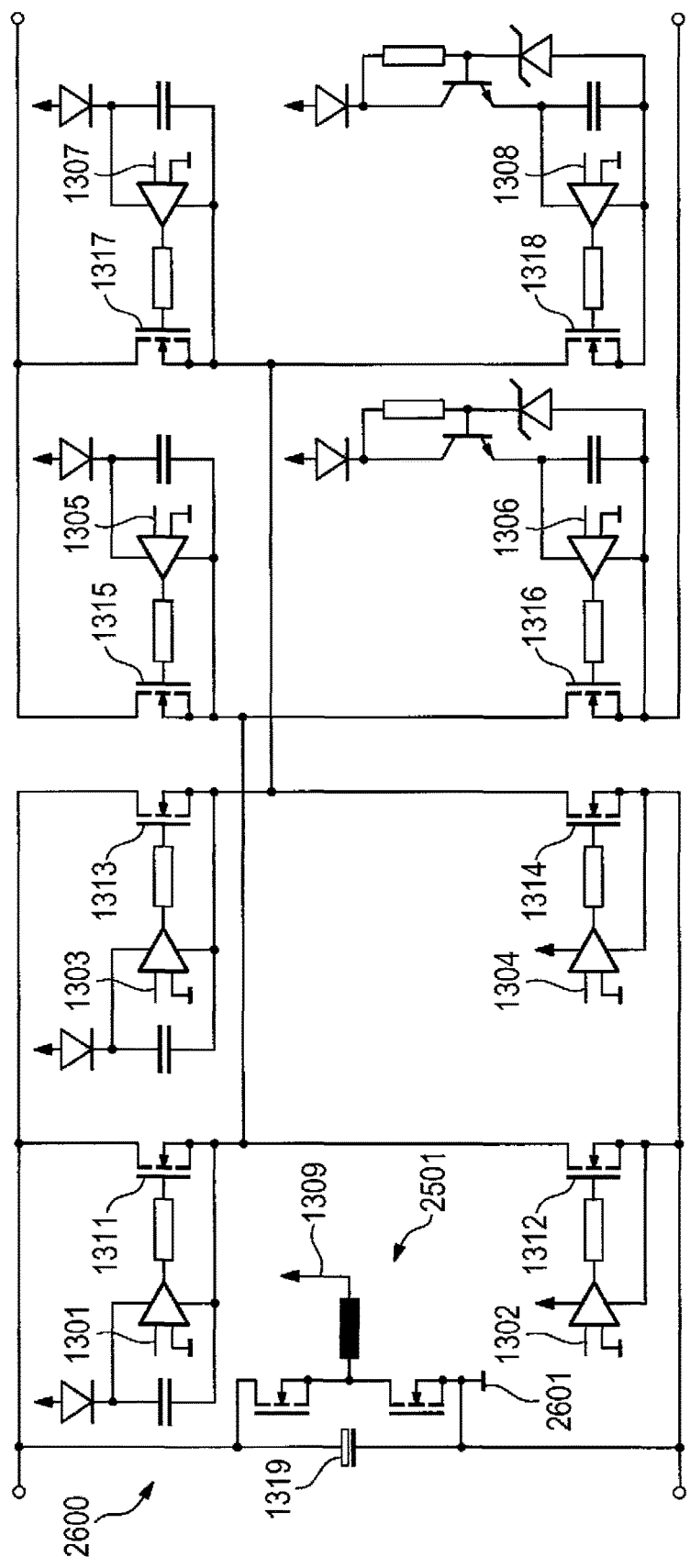
FIGS. 19A and 19B are schematic representations of example circuits and a module controller connected to the reference potential of the supply voltage, for implementing an embodiment of the invention.
Figure 19B:
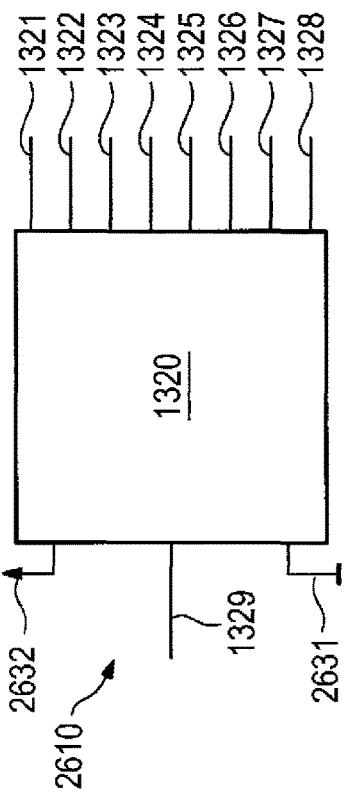

FIGS. 19A and 19B are schematic representations of an example circuit 2600 and a module controller 1320 connected to the reference potential of the supply voltage 1309 for implementing an embodiment of the method according the invention, the buck converter 2501 also being connected to earth 2601. In order to allow the supply voltage 1309 to be used to control the circuit 2600 in FIG. 19A, the module controller 1320, which provides the signals 1321, 1322, 1323, 1324, 1325, 1326, 1227, 1328 for the power semiconductor switches 1311, 1312, 1313, 1314, 1315, 1316, 1317, 1318 of circuit 2600, is connected with its ground 2631 to the reference potential of the supply voltage 1309 and connected to the supply voltage 1309 to provide a supply 2632. This may be implemented with an additional, non-galvanically isolated buck converter or a linear regulator if the voltage is intended to be lower.

Figure 20A:
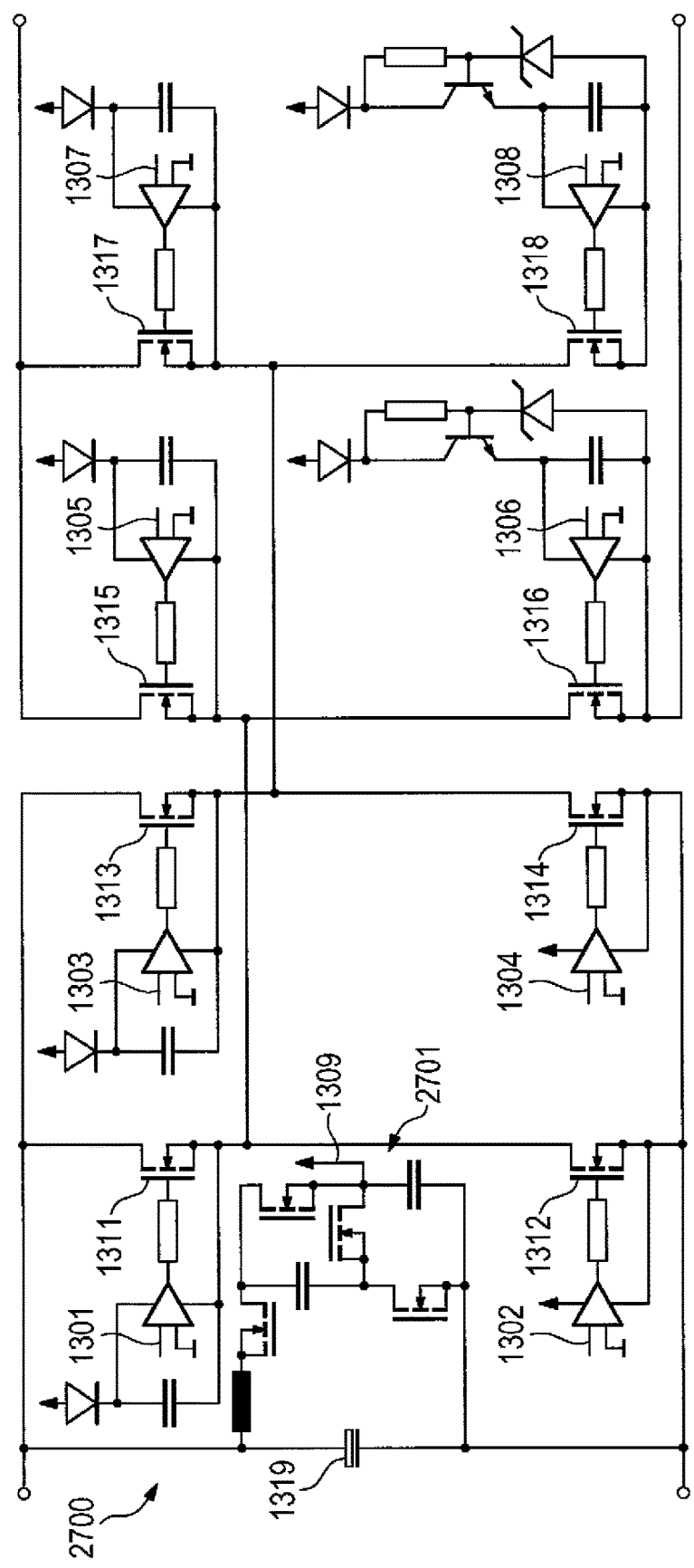
FIGS. 20A and 20B are schematic representations of example circuits having a switched-capacitor converter for implementing an embodiment of the invention.
Figure 20B:
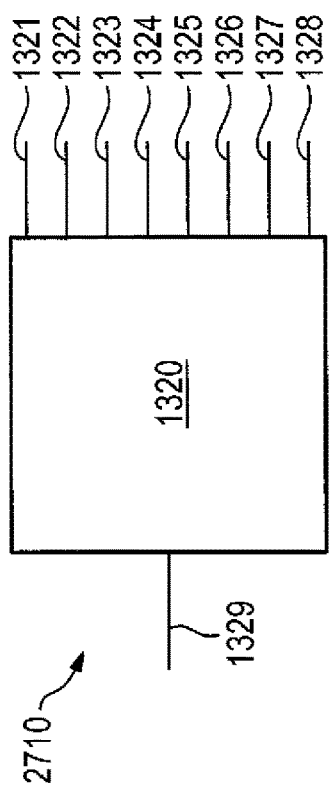

FIGS. 20A and 20B are schematic representations of an example circuit 2700 having a switched-capacitor converter 2701, and a circuit diagram 2710 for a module controller 1320 for implementing an embodiment of the method according to the invention. The galvanically non-isolating buck converter 2501 from circuit 2500 in FIG. 18 is now implemented by a switched-capacitor converter 2701. The embodiment shown is as a two-stage, voltage-halving converter, wherein capacitors are charged serially on the input side and discharged in parallel at the output. For a lower output voltage, more stages are also possible.

The invention claimed is:

1. A method for flexible bootstrapping in a power electronics circuit having at least one power semiconductor switch and an energy storage device used for controlling the at least one power semiconductor switch, the energy storage device and a source/emitter potential of the power semiconductor switch being at the same potential, the power electronics circuit further having a blocking diode connected to a supply voltage that is provided by a source and is referenced to a reference potential so that the source can emit energy via the blocking diode but cannot absorb energy via the blocking diode, and the blocking diode is followed by first and second bootstrap transistors, drain/collector inputs of the first and second bootstrap transistors are connected to the blocking diode and source/emitter outputs of the first and second bootstrap transistors are connected to an upper potential of the energy storage device, at least one resistor connected between the blocking diode and a gate/base control terminal of the first bootstrap transistor, thereby causing a charging of the energy storage device as soon as the reference potential of the supply voltage is above a potential of the energy storage device, and preventing overcharging as soon as a potential difference predefined in the electrical component is exceeded, and thereby preventing discharging of the energy storage device by the blocking diode, wherein the method comprises:

maintaining a voltage upper limit in the energy storage device by using the first bootstrap transistor and a first electrical component that is designed to pass a first current flow when a first predefined potential difference is exceeded, and maintaining the voltage upper limit in the energy storage device by using the second bootstrap transistor and a second electrical component that is designed to pass a second current flow if a second predefined potential difference is exceeded thereby maintaining a current limit when the power semiconductor switch is activated.

2. The method of claim 1, wherein the energy storage device is a bootstrap capacitor.

3. The method of claim 1, wherein at least one of the first and second bootstrap transistors is a bipolar transistor.

4. The method of claim 2, wherein at least one of the first and second bootstrap transistors is a field effect transistor.

5. The method of claim 1, wherein at least one of the first and second electrical components is a Zener diode.

6. The method of claim 1, wherein when at least one of the first and second bootstrap transistors is an n-channel field effect transistor or an npn-bipolar transistor, the at least one resistor is a pull-up resistor.

7. The method of claim 1, wherein when the first bootstrap transistor is a p-channel field effect transistor or a pnp-bipolar transistor, the at least one resistor is a pull-down resistor.

8. A charging circuit for flexible bootstrapping in a power electronics circuit having at least one power semiconductor switch and an energy storage device that is used to control the at least one power semiconductor switch, the energy storage device and a source/emitter potential of the at least one power semiconductor switch being at the same potential, the charging circuit comprising:

a blocking diode connected to a supply voltage that is provided by a source and is referenced to a reference potential so that the source can emit energy via the blocking diode but cannot absorb energy via the blocking diode;

a first electrical component configured to pass a first current flow if a specified first potential difference is exceeded and a second electrical component configured to pass a second current flow if a specified second potential difference is exceeded;

first and second bootstrap transistors having respective inputs connected to the blocking diode in a forward direction and having respective outputs connected to an upper potential of the energy storage device in the forward direction, at least one resistor connected between the blocking diode and a gate/base control terminal of the first bootstrap transistor, thereby causing a charging of the energy storage device as soon as the reference potential of the supply voltage is above a potential of the energy storage device, and preventing overcharging as soon as a potential difference predefined in the respective electrical component is exceeded, and thereby preventing discharging of the energy storage device by the blocking diode wherein a voltage upper limit in the energy storage device is maintained by the first bootstrap transistor and the first electrical component, which is designed to pass the first current flow when the specified first potential difference is exceeded, and by the second bootstrap transistor and the second electrical component, which is designed to pass the second current flow if the specified second potential difference is exceeded so that a current limit is maintained when the power semiconductor switch is activated.

9. The charging circuit of claim 8, wherein the energy storage device is a bootstrap capacitor.

10. A multilevel converter comprising at least one module storage element and at least one charging circuit in accordance with claim 8.

* * * * *